US012713595B2

(12) United States Patent
Rajashekharaiah et al.

(10) Patent No.: US 12,713,595 B2
(45) Date of Patent: Aug. 18, 2026

(54) MEMORY DEVICE INCLUDING PREFORMED RECESSES BETWEEN CONTACT STRUCTURES AND CONTROL GATES

(71) Applicant: Micron Technology, Inc., Boise, ID (US)

(72) Inventors: Mallesh Rajashekharaiah, Boise, ID (US); Lifang Xu, Boise, ID (US); Nancy M. Lomeli, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 951 days.

(21) Appl. No.: 17/876,271

(22) Filed: Jul. 28, 2022

(65) Prior Publication Data

US 2023/0397421 A1 Dec. 7, 2023

Related U.S. Application Data

(60) Provisional application No. 63/347,872, filed on Jun. 1, 2022.

(51) Int. Cl.

| | |
|---|---|
| ***H10B 43/27*** | (2023.01) |
| ***H10B 41/10*** | (2023.01) |
| ***H10B 41/27*** | (2023.01) |
| ***H10B 41/35*** | (2023.01) |
| ***H10B 43/10*** | (2023.01) |
| ***H10B 43/35*** | (2023.01) |

(52) U.S. Cl.

CPC ............. *H10B 43/27* (2023.02); *H10B 41/10* (2023.02); *H10B 41/27* (2023.02); *H10B 41/35* (2023.02); *H10B 43/10* (2023.02); *H10B 43/35* (2023.02)

(58) Field of Classification Search

CPC .................... H10B 41/00–70; H10B 43/00–50

See application file for complete search history.

(56) References Cited

U.S. PATENT DOCUMENTS

| | | | | |
|---|---|---|---|---|
| 9,425,209 | B1 * | 8/2016 | Yang ...................... | H10B 43/27 |
| 10,002,880 | B1 * | 6/2018 | Nagashima ............ | H10B 43/27 |
| 2009/0224309 | A1 * | 9/2009 | Kidoh .................... | H10B 43/50 257/326 |
| 2015/0179564 | A1 * | 6/2015 | Lee ........................ | H10B 43/50 257/773 |
| 2015/0255385 | A1 * | 9/2015 | Lee ........................ | H10B 43/50 257/775 |

(Continued)

*Primary Examiner* — Eric A. Ward

(74) *Attorney, Agent, or Firm* — Schwegman Lundberg & Woessner, P.A.

(57) ABSTRACT

Some embodiments include apparatuses and methods of forming the apparatuses. One of the apparatuses includes tiers located one over another, the tiers including conductive materials that form part of respective control gates for memory cells of the apparatus; a staircase structure formed in the tiers, the conductive materials including respective portions that collectively form a part of the staircase structure, the staircase structure including a sidewall on a side of the staircase structure; a dielectric liner formed on the sidewall; recesses formed in respective tiers and adjacent the sidewall such that respective portions of the dielectric liner are located in the recesses; and a contact structure extending through a portion of the dielectric liner, wherein the portions of the dielectric liner are between the contract structure and the conductive materials.

14 Claims, 23 Drawing Sheets

(56) References Cited

U.S. PATENT DOCUMENTS

| | | | | |
|---|---|---|---|---|
| 2015/0255484 | A1* | 9/2015 | Imamura | H10B 41/27<br>257/314 |
| 2018/0277561 | A1* | 9/2018 | Yamamoto | H10B 43/27 |
| 2020/0091071 | A1* | 3/2020 | Lee | H01L 21/76816 |
| 2020/0144380 | A1* | 5/2020 | Hwang | H10B 41/10 |
| 2020/0152654 | A1* | 5/2020 | Hwang | H10B 41/10 |
| 2021/0020658 | A1* | 1/2021 | Eom | H10B 43/27 |
| 2021/0134736 | A1* | 5/2021 | Jhothiraman | H01L 21/76895 |
| 2023/0232629 | A1* | 7/2023 | Ma | H10B 41/50<br>257/314 |

* cited by examiner

200
BLOCK
292
BLOCK
290
201
SGD0
SGDi
SGS
WLM
WL1
WL0
SL
BL0
BL1
BL2
BLN
2700
2701
2702
270N
230
261i
2610
202
260
250M
2501
2500
281i
2810
280
291
298
Z
Y
X

200

3D
290
291
292
351B
351C
3G
348
344
347
201
270N
270N-1
BLN
BLN-1
230
330
Y
X 290
351B
$333_{S1}$
$333_{SW1}$
291
3D
333
$333_{SW2}$
$333_{S2}$
351C
292
344
$340_{SGS}$
340E1
$365_{SGS}$
$340_0$
340E2
$365_0$
3G
3G
$340_1$
340E3
$365_1$
$340_{M-1}$
340E4
$365_{M-1}$
$340_M$
340E5
$365_M$
Y
X

X
Z
345
346
345
346
345
346
SUBSTRATE 399
CIRCUITRY 395
421
422
200

333S2
721
533
333S1
721
421
422
721R
345
346
CIRCUITRY 395
SUBSTRATE 399
Z
X
200

10B
10B
421
422
721
822
333L
333S1
333S2
1044
1044W
921
533
345
346
CIRCUITRY 395
SUBSTRATE 399
Z
X
200

200

MEMORY DEVICE INCLUDING PREFORMED RECESSES BETWEEN CONTACT STRUCTURES AND CONTROL GATES

This application claims the benefit of priority to U.S. Provisional Application Ser. No. 63/347,872, filed Jun. 1, 2022, which is incorporated herein by reference in its entirety.

FIELD

Embodiments described herein relate to memory devices including vertical conductive structures in memory blocks.

BACKGROUND

Some conventional memory devices have vertical conductive structures as part of conductive paths that provide electrical signals between elements of the memory device. The memory device also has memory cells and conductive control gates for the memory cells. The conductive control gates are formed on respective horizontal levels of the memory device. At some locations of the memory device, the conductive control gates are adjacent the vertical conductive structures. The memory device has a dielectric material to provide electrical separation between the control gates and the vertical conductive structures in such locations. The dielectric material is usually formed with a certain thickness. However, in some conventional memory devices, the thickness of the dielectric material at some regions of the device may not be thick enough to provide the intended electrical separation between the control gates and the vertical conductive structure at such regions. This lack of thickness can be due to the ways some conventional processes of forming such conventional memory devices are performed. The lack of thickness as described herein can reduce device reliability and performance.

DETAILED DESCRIPTION

The techniques described herein involve a memory device having contact structures and control gates (e.g., word lines) for memory cells of the memory device. The contact structures are part of additional conductive paths between other components in the memory device. The memory device also has dielectric portions formed in recesses between the contact structures and respective control gates. As described above, some conventional memory devices lack dielectric material thickness at some regions of the memory device, leading to reduced device reliability and performance. The techniques described herein include processes (methods) that can form (e.g., preform) recesses and dielectric portions in the recesses between contact structures and the control gates adjacent the contact structures. The described memory device includes a staircase structure at which the conductive contacts are formed to provide electrical connections to the control gates. Some of the conductive structures are also formed adjacent the control gates at the staircase structure. Forming the memory device using the described methods can increase the reliability and performance of the memory device. Other improvements and benefits of the described techniques are further discussed below with reference to FIG. 1 through FIG. 15.

Figure 1:
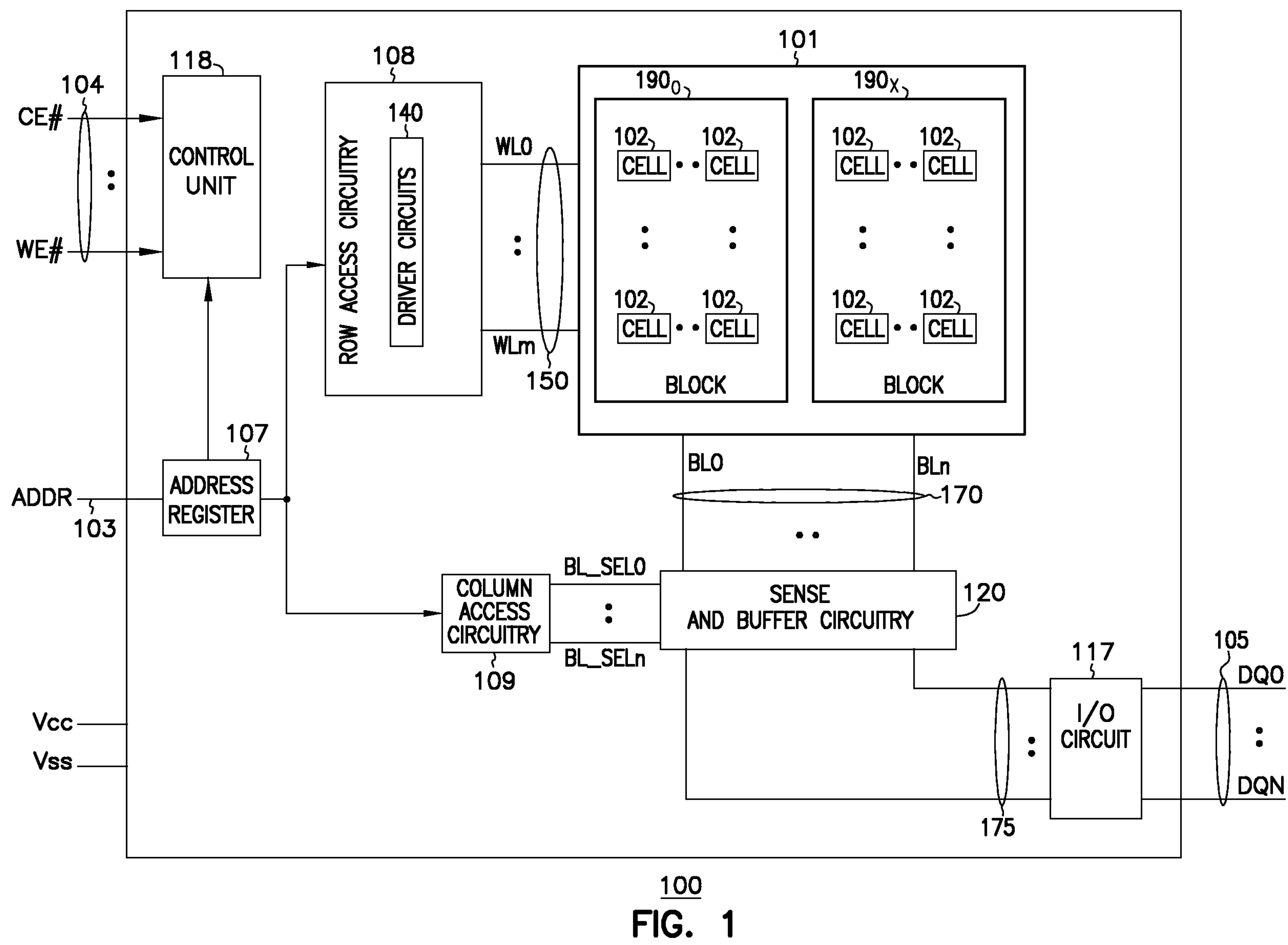
FIG. 1 shows an apparatus in the form of a memory device, according to some embodiments described herein.

FIG. 1 shows an apparatus in the form of a memory device 100, according to some embodiments described herein. Memory device 100 can include a memory array (or multiple memory arrays) 101 containing memory cells 102 arranged in blocks (blocks of memory cells), such as blocks $\mathbf{190}_0$ through $\mathbf{190}_X$ (e.g., there are X+1 blocks in memory device 100). In the physical structure of memory device 100, memory cells 102 can be arranged vertically (e.g., stacked one over another) over a substrate (e.g., a semiconductor substrate) of memory device 100.

As shown in FIG. 1, memory device 100 can include access lines 150 and data lines 170. Access lines 150 can include word lines, which can include global word lines and local word lines (e.g., control gates). Data lines 170 can include bit lines (e.g., local bit lines). Access lines 150 can carry signals (e.g., word line signals) WL0 through WLm. Data lines 170 can carry signals (e.g., bit line signals) BL0 through BLn. Memory device 100 can use access lines 150 to selectively access memory cells 102 of blocks $\mathbf{190}_0$ through $\mathbf{190}_x$ and data lines 170 to selectively exchange information (e.g., data) with memory cells 102.

Memory device 100 can include an address register 107 to receive address information (e.g., address signals) ADDR on lines (e.g., address lines) 103. Memory device 100 can include row access circuitry 108 and column access circuitry 109 that can decode address information from address register 107. Based on decoded address information, memory device 100 can determine which memory cells 102 of which blocks $\mathbf{190}_0$ through $\mathbf{190}_x$ are to be accessed during a memory operation. Memory device 100 can include drivers (driver circuits) 140, which can be part of row access circuitry 108. Drivers 140 can operate (e.g., operate as switches) to form (or not to form) conductive paths (e.g., current paths) between nodes (e.g., global access lines)

providing voltages and respective access lines 150 during operations of memory device 100.

Memory device 100 can perform a read operation to read (e.g., sense) information (e.g., previously stored information) from memory cells 102 of blocks $\mathbf{190}_0$ through $\mathbf{190}_x$, or a write (e.g., programming) operation to store (e.g., program) information in memory cells 102 of blocks $\mathbf{190}_0$ through $\mathbf{190}_x$. Memory device 100 can use data lines 170 associated with signals BL0 through BLn to provide information to be stored in memory cells 102 or obtain information read (e.g., sensed) from memory cells 102. Memory device 100 can also perform an erase operation to erase information from some or all of memory cells 102 of blocks $\mathbf{190}_0$ through $\mathbf{190}_x$.

Memory device 100 can include a control unit 118 that can be configured to control memory operations of memory device 100 based on control signals on lines 104. Examples of the control signals on lines 104 include one or more clock signals and other signals (e.g., a chip-enable signal CE #, a write-enable signal WE #) to indicate which operation (e.g., read, write, or erase operation) memory device 100 can perform. Other devices external to memory device 100 (e.g., a memory controller or a processor) may control the values of the control signals on lines 104. Specific values of a combination of the signals on lines 104 may produce a command (e.g., read, write, or erase command) that may cause memory device 100 to perform a corresponding memory operation (e.g., read, write, or erase operation).

Memory device 100 can include sense and buffer circuitry 120 that can include components such as sense amplifiers and page buffer circuits (e.g., data latches). Sense and buffer circuitry 120 can respond to signals BL_SEL0 through BL_SELn from column access circuitry 109. Sense and buffer circuitry 120 can be configured to determine (e.g., by sensing) the value of information read from memory cells 102 (e.g., during a read operation) of blocks $\mathbf{190}_0$ through $\mathbf{190}_x$ and provide the value of the information to lines 175, which can include global data lines (e.g., global bit lines). Sense and buffer circuitry 120 can also be configured to use signals on lines 175 to determine the value of information to be stored (e.g., programmed) in memory cells 102 of blocks $\mathbf{190}_0$ and $\mathbf{190}_x$ (e.g., during a write operation) based on the values (e.g., voltage values) of signals on lines 175 (e.g., during a write operation).

Memory device 100 can include input/output (I/O) circuitry 117 to exchange information between memory cells 102 of blocks $\mathbf{190}_0$ through $\mathbf{190}_x$ and lines (e.g., I/O lines) 105. Signals DQ0 through DQN on lines 105 can represent information read from or stored in memory cells 102 of blocks $\mathbf{190}_0$ through $\mathbf{190}_x$. Lines 105 can include nodes within memory device 100 or pins (or solder balls) on a package where memory device 100 can reside. Other devices external to memory device 100 (e.g., a memory controller or a processor) can communicate with memory device 100 through lines 103, 104, and 105.

Memory device 100 can receive a supply voltage, including supply voltages Vcc and Vss. Supply voltage Vss can operate at a ground potential (e.g., having a value of approximately zero volts). Supply voltage Vcc can include an external voltage supplied to memory device 100 from an external power source such as a battery or alternating current to direct current (AC-DC) converter circuitry.

Each of memory cells 102 can be programmed to store information representing a value of at most one bit (e.g., a single bit), or a value of multiple bits such as two, three, four, or another number of bits. For example, each of memory cells 102 can be programmed to store information representing a binary value “0” or “1” of a single bit. The single bit per cell is sometimes called a single-level cell. In another example, each of memory cells 102 can be programmed to store information representing a value for multiple bits, such as one of four possible values “00”, “01”, “10”, and “11” of two bits, one of eight possible values “000”, “001”, “010”, “011”, “100”, “101”, “110”, and “111” of three bits, or one of other values of another number of multiple bits. A cell that can store multiple bits is sometimes called a multi-level cell (or multi-state cell).

Memory device 100 can include a non-volatile memory device, and memory cells 102 can include non-volatile memory cells, such that memory cells 102 can retain information stored thereon when power (e.g., voltage Vcc, Vss, or both) is disconnected from memory device 100. For example, memory device 100 can be a flash memory device, such as a NAND flash (e.g., 3-dimensional (3-D) NAND) or a NOR flash memory device, or another kind of memory device, such as a variable resistance memory device (e.g., a phase change memory device or a resistive Random-Access Memory (RAM) device.

One of ordinary skill in the art may recognize that memory device 100 may include other components, several of which are not shown in FIG. 1 so as not to obscure the example embodiments described herein. At least a portion of memory device 100 can include structures and perform operations similar to or identical to the structures and operations of any of the memory devices described below with reference to FIG. 2 through FIG. 15.

Figure 2:
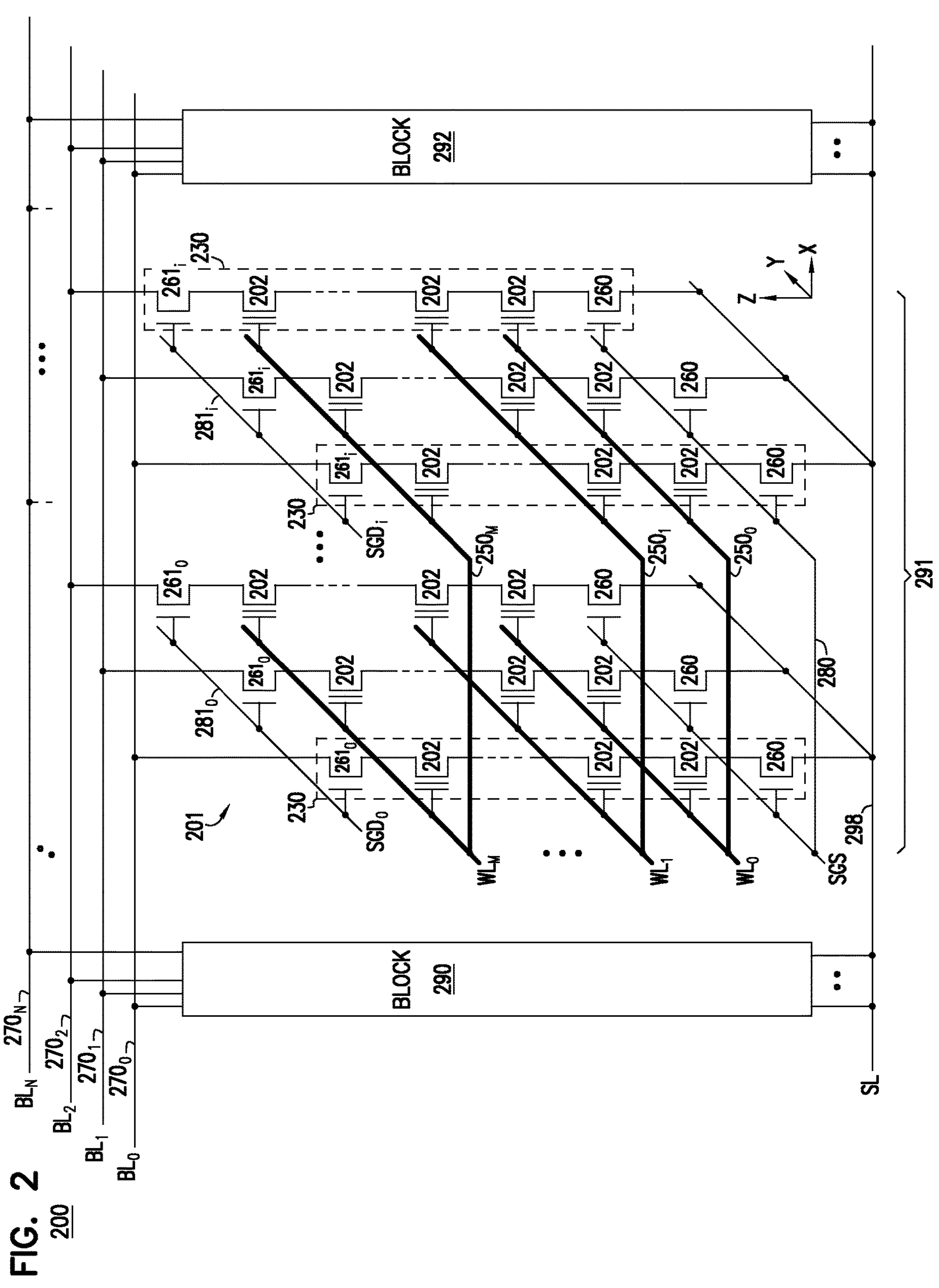
FIG. 2 shows a schematic of a memory device having a memory array and memory cell blocks, according to some embodiments described herein.

FIG. 2 shows a schematic of a memory device 200 having a memory array 201, and blocks (e.g., memory cell blocks) 290, 291, and 292, according to some embodiments described herein. For simplicity, only detail for elements of block 291 is shown in FIG. 2. Blocks 290 and 292 have similar elements as block 291.

Memory device 200 can include a non-volatile (e.g., NAND flash memory device) or other types of memory devices. Memory device 200 can correspond to memory device 100. For example, memory array (or multiple memory arrays) 201 and blocks 290, 291, and 292 can correspond to memory array 101 and three of blocks $\mathbf{190}_0$ through $\mathbf{190}_x$, respectively, of memory device 100 of FIG. 1.

As shown in FIG. 2, memory device 200 can include memory cells 202, data lines $\mathbf{270}_0$ through $\mathbf{270}_N$ ($\mathbf{270}_0$-$\mathbf{270}_N$), and control gates $\mathbf{250}_0$ through $\mathbf{250}_M$ in block 291. Data lines $\mathbf{270}_0$-$\mathbf{270}_N$ can correspond to part of data lines 170 of memory device 100 of FIG. 1. In FIG. 2, label “N” (index N) next to a number (e.g., $\mathbf{270}_N$) represents the number of data lines of memory device 200. For example, if memory device 200 includes 16 data lines, then N is 15 (data lines $\mathbf{270}_0$ through $\mathbf{270}_{127}$). In FIG. 2, label “M” (index M) next to a number (e.g., 250m) represents the number of control gates of memory device 200. For example, if memory device 200 includes 128 control gates, then M is 127 (control gates $\mathbf{250}_0$ through $\mathbf{250}_{127}$). Memory device 200 can have the same number of control gates (e.g., M−1 control gates) among the blocks (e.g., blocks 290, 291, and 292) of memory device 200.

In FIG. 2, data lines $\mathbf{270}_0$-$\mathbf{270}_N$ can include (or can be part of) bit lines (e.g., local bit lines) of memory device 200. As shown in FIG. 2, data lines $\mathbf{270}_0$-$\mathbf{270}_N$ can carry signals (e.g., bit line signals) $BL_0$ through $BL_N$, respectively. In the physical structure of memory device 200, data lines $\mathbf{270}_0$-$\mathbf{270}_N$ can be structured as conductive lines and have respective lengths extending in the Y-direction (e.g., a direction from one memory block to another).

FIG. 2 shows directions X, Y, and Z that can be relative to the physical directions (e.g., dimensions) of the structure of memory device 200. For example, the Z-direction can be a direction perpendicular to (e.g., vertical direction with respect to) a substrate of memory device 200 (e.g., a substrate 399 shown in FIG. 3D). The Z-direction is perpendicular to the X-direction and Y-direction (e.g., the Z-direction is perpendicular to an X-Y plane of memory device 200).

As shown in FIG. 2, memory cells 202 can be organized into separate blocks (memory blocks or blocks of memory cells) such as blocks 290, 291, and 292. FIG. 2 shows memory device 200 including three blocks 290, 291, and 292 as an example. However, memory device 200 can include numerous blocks. The blocks (e.g., blocks 290, 291, and 292) of memory device 200 can share data lines (e.g., data lines $270_0$-$270_N$) to carry information (in the form of signals) read from or to be stored in memory cells of selected memory cells (e.g., selected memory cells in block 290, 291, or 292) of memory device 200.

Control gates $250_0$-$250_M$ in block 291 can be part of access lines (e.g., word lines). The access lines (that include control gates $250_0$-$250_M$) of memory device 200 can correspond to access lines 150 of memory device 100 of FIG. 1.

Other blocks (e.g., blocks 290 and 292) of memory device 200 can have control gates similar to (or the same as) control gates $250_0$-$250_M$ of block 291. Blocks 290, 291, and 292 can be accessed separately (e.g., accessed one block at a time). For example, block 291 can be accessed at one time using control gates $250_0$-$250_M$, and block 290 or 291 can be accessed at another time using control gates in the respective block.

In the physical structure of memory device 200, control gates $250_0$-$250_M$ can be formed on different levels (e.g., layers) of memory device 200 in the Z-direction. In this example, the levels (e.g., layers) of control gates $250_0$-$250_M$ can be formed (e.g., stacked) one level (one layer of material) over another (another layer of material) in the Z-direction.

As shown in FIG. 2, memory cells 202 can be included in respective memory cell strings 230. For simplicity, only three memory cell strings 230 are labeled in FIG. 2. Each of memory cell strings 230 can have series-connected memory cells (e.g., M+1 (e.g., 128) series-connected memory cells) in the Z-direction. In a physical structure of memory device 200, memory cells 202 in each of memory cell strings 230 can be formed (e.g., stacked vertically one over another) in different levels (physical portions) of memory device 200. The levels of memory device 200 can be included in (or can correspond to) respective tiers (stacked one over another in the Z-direction) of memory device 200. In the example of FIG. 2, memory device 200 can include M+1 tiers (e.g., 128 tiers, where M=127) of memory cells and respective control gates. The number of memory cells 202 in each of memory cell strings 230 can be equal to the number of levels (e.g., the number of tiers). Thus, in the example of FIG. 2, there can be 128 levels (layers) of memory cells 202 in the Z-direction.

The number of memory cells 202 in each of memory cell strings 230 can also be equal to the number of levels (e.g., the number of tiers) of control gates (e.g., control gates $250_0$-$250_M$) of memory device 200. For example, if each memory cell string 230 has 128 (e.g., M=127) memory cells 202, then there are 128 corresponding levels (e.g., 128 tiers) of control gates $250_0$-$250_M$ for the 128 memory cells.

As shown in FIG. 2, control gates $250_0$-$250_M$ can carry corresponding signals $WL_0$-$WL_M$. As mentioned above, control gates $250_0$-$250_M$ can include (or can be parts of) access lines (e.g., word lines) of memory device 200. Each of control gates $250_0$-$250_M$ can be part of a structure (e.g., a level) of a conductive material (e.g., a layer of conductive material) located in a level of memory device 200. Memory device 200 can use signals $WL_0$-$WL_M$ to selectively control access to memory cells 202 of block 291 during an operation (e.g., read, write, or erase operation). For example, during a read operation, memory device 200 can use signals $WL_0$-$WL_M$ to control access to memory cells 202 of block 291 to read (e.g., sense) information (e.g., previously stored information) from memory cells 202 of block 291. In another example, during a write operation, memory device 200 can use signals $WL_0$-$WL_M$ to control access to memory cells 202 of block 291 to store information in memory cells 202 of block 291.

As shown in FIG. 2, memory cells in different memory cell strings in block 291 can share (e.g., can be controlled by) the same control gate in block 291. For example, memory cells 202 (of different memory cell strings 230) coupled to control gate $250_0$ can share (can be controlled by) control gate $250_0$. In another example, memory cells 202 (of different memory cell strings 230) coupled to control gate $250_1$ can share (can be controlled by) control gate $250_1$.

Memory device 200 can include a source 298 that can carry a signal (e.g., a source line signal) SL. In the physical structure of memory device 200, source 298 and be called a source structure, a source region, a source plate, or source line. Source 298 can include (e.g., can be formed from) a conductive structure (e.g., conductive region) of memory device 200. The conductive structure of source 298 can include multiple levels (e.g., layers) of conductive materials stacked one over another over a substrate of memory device 200. Source 298 can be common conductive structure (e.g., common source plate or common source region) of block 290, 291, and 292. Source 298 can be coupled to a ground connection (e.g., ground plate) of memory device 200. Alternatively, source 298 can be coupled to a connection (e.g., a conductive region) that is different from a ground connection.

As shown in FIG. 2, memory device 200 can include select transistors (e.g., drain select transistors) $261_0$ through $261_i$ ($261_0$-$261_i$) and select gates (e.g., drain select gates (SGDs)) $281_0$ through $281_i$ in block 291. Transistors $261_0$ can share the same select gate $281_0$. Transistors $261_i$ can share the same select gate $281_i$. Select gates $281_0$-$281_i$ can carry signals $SGD_0$ through $SGD_i$($SGD_0$-$SGD_i$), respectively.

Transistors $261_0$-$261_i$ can be controlled (e.g., turned on or turned off) by signals $SGD_0$-$SGD_i$, respectively. During a memory operation (e.g., a read or write operation) of memory device 200, transistors $261_0$ and transistors $261_i$ can be turned on one group at a time (e.g., either the group of transistors $261_0$ or the group of transistors $261_i$ can be turned on at a particular time). Transistors $261_0$ can be turned on (e.g., by activating signal $SGD_0$) to couple memory cell strings 230 of block 291 to respective data lines $270_0$-$270_N$. Transistors $261_i$ can be turned on (e.g., by activating signal $SGD_i$) to couple memory cell strings 230 of block 291 to respective data lines $270_0$-$270_N$. Transistors $261_0$-$261_i$ can be turned off (e.g., by deactivating signals $SGD_0$-$SGD_i$) to decouple the memory cell strings 230 of block 291 from respective data lines $270_0$-$270_N$.

Memory device 200 can include transistors (e.g., source select transistors) 260 in block 291, each of which can be coupled between source 298 and memory cells 202 in a respective memory cell string (one of memory cell strings 230) of block 291. Memory device 200 can include a select gate (e.g., source select gate (SGS)) 280 that can be shared by transistors 260. Transistors 260 can be controlled (e.g., turned on or turned off) by the same signal, such as SGS signal (e.g., source select gate signal) provided on select gate 280. During a memory operation (e.g., a read or write operation) of memory device 200, transistors 260 can be turned on (e.g., by activating an SGS signal) to couple memory cell strings 230 to source 298. Transistors 260 can be turned off (e.g., by deactivating the SGS signal) to decouple memory cell strings 230 from source 298.

Memory device 200 includes other components, which are not shown in FIG. 2 so as not to obscure the example embodiments described herein. Some of the structures of memory device 200 are described below with reference to FIG. 3A through FIG. 15. For simplicity, detailed description of the same element among the drawings (FIG. 1 through FIG. 15) is not repeated.

Figure 3A:
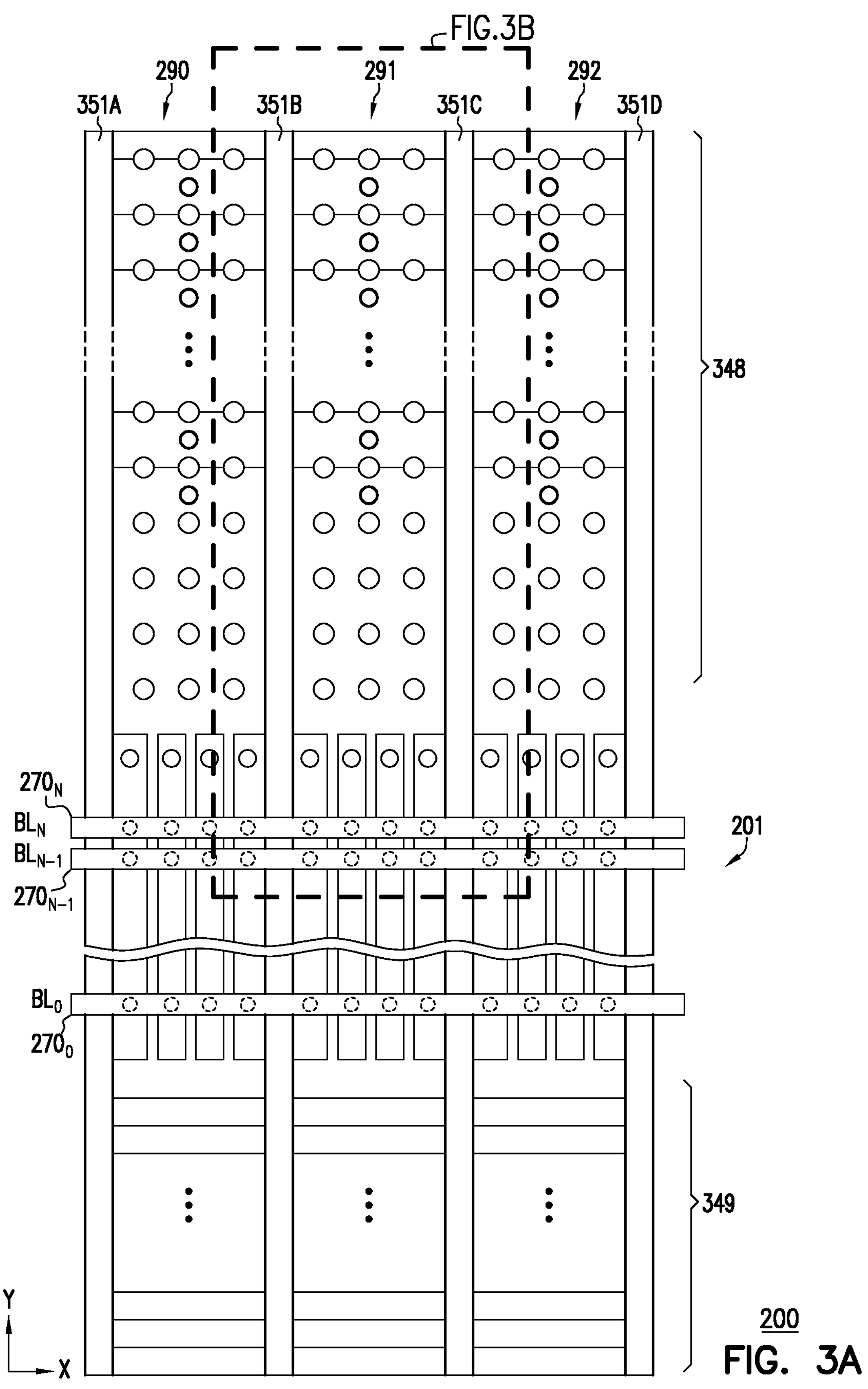
FIG. 3A shows a top view of a structure of the memory device of FIG. 2 including the memory array, staircase regions, and dielectric structures between respective blocks of the memory device, according to some embodiments described herein.

FIG. 3A shows a top view of a structure of memory device 200 including a memory array (memory cell array) 201, staircase regions 348 and 349, and dielectric structures (e.g., block dividers) 351A, 351B, 351C, and 351D between respective blocks 290, 291, and 292, according to some embodiments described herein.

In the figures (drawings) herein, similar or the same elements of memory device 200 of FIG. 2 and other figures (e.g., FIG. 3A through FIG. 15) are given the same labels. Detailed descriptions of similar or the same elements may not be repeated from one figure to another figure. For simplicity, cross-sectional lines (e.g., hatch lines) are omitted from some or all the elements shown in the drawings described herein. Some elements of memory device 200 may be omitted from a particular figure of the drawings so as not to obscure the view or the description of the element (or elements) being described in that particular figure. Further, the dimensions (e.g., physical structures) of the elements shown in the drawings described herein are not scaled.

As shown in FIG. 3A, blocks (blocks of memory cells) 290, 291, and 292 of memory device 200 can be located side-by-side from one block to another in the X-direction. Three blocks 290, 291, and 292 are shown as an example. Memory device 200 can include numerous blocks. Block 291 of FIG. 3A is schematically shown and described above with reference to FIG. 2.

In FIG. 3A, dielectric structures 351A, 351B, 351C, and 351D can be formed to divide (e.g., organize) memory device 200 into physical blocks (e.g., blocks 290, 291, and 292). Dielectric structures 351A, 351B, 351C, and 351D can have lengths extending in the Y-direction. Each of dielectric structures 351A, 351B, 351C, and 351D can include (or can be formed in) a slit (e.g., like slits 351B' and 351C' in FIG. 14) between two adjacent blocks. The slit can have sidewalls (e.g., edges) opposing each other in the X-direction and adjacent two respective blocks. The slit can include (or can be) a trench having a depth in the Z-direction. For example, dielectric structure 351B can be formed (e.g., located) in a slit between blocks 290 and 291, in which the slit can have opposing sidewalls (e.g., edges) adjacent respective blocks 290 and 291. Dielectric structure 351C can be formed in a slit between blocks 291 and 292, in which the slit can have opposing sidewalls adjacent respective blocks 291 and 292. Other dielectric structures 351A and 351D can be located adjacent respective blocks shown in FIG. 3A.

Each of dielectric structures 351A, 351B, 351C, and 351D can include dielectric materials (e.g., dielectric materials 1421 and 1423 in FIG. 3G) formed in a respective slit. Dielectric structures 351A, 351B, 351C, and 351D can separate (e.g., physically and electrically separate) one block from another. For example, as shown in FIG. 3A, dielectric structure 351B can separate block 291 from block 290. Dielectric structure 351C can separate block 291 from block 292.

As shown in FIG. 3A, data lines $\mathbf{270}_0$ through $\mathbf{270}_N$ (associated with signals $BL_0$ through $BL_N$) of memory device 200 can be located over blocks 290, 291, and 292 (with respect to the Z-direction). Data lines $\mathbf{270}_0$ through $\mathbf{270}_N$ can have respective lengths extending in the X-direction. Data lines $\mathbf{270}_0$ through $\mathbf{270}_N$ can extend over (e.g., on top of) and across (in the X-direction) blocks 290, 291, and 292 and can be shared by blocks 290, 291, and 292.

Staircase regions 348 and 349 of memory device 200 can be located on respective sides (in the Y-direction) of memory array 201. Staircase regions 348 and 349 are part of memory device 200 where conductive contacts (labeled in FIG. 3B and FIG. 3C, e.g., conductive contacts $\mathbf{365}_{SGS}$, $\mathbf{365}_0$, $\mathbf{365}_1$, $\mathbf{365}_{M-1}$, $\mathbf{365}_M$, and $\mathbf{365}_{SGD0}$ through $\mathbf{365}_{SGDi}$) can be formed to provide electrical connections (e.g., signals) to respective select gates and control gates (e.g., shown in FIG. 2 as select gates 280, $\mathbf{281}_0$ and $\mathbf{281}_i$ and control gates $\mathbf{250}_0$ through $\mathbf{250}_M$) in respective blocks 290, 291, and 292 of memory device 200. Staircase regions 348 and 349 can also include other structures (e.g., contact structures 344, described below).

In FIG. 3A, staircase regions 348 and 349 can include similar structures. However, for simplicity, details of staircase region 349 are omitted from the description herein. In an alternative structure of memory device 200, staircase region 349 can be omitted from memory device 200, such that only staircase region 348 (and not both staircase regions 348 and 349) is included in memory device 200. A portion labeled "FIG. 3B" in FIG. 3A is shown in detail in FIG. 3B.

Figures 3B, 3C:
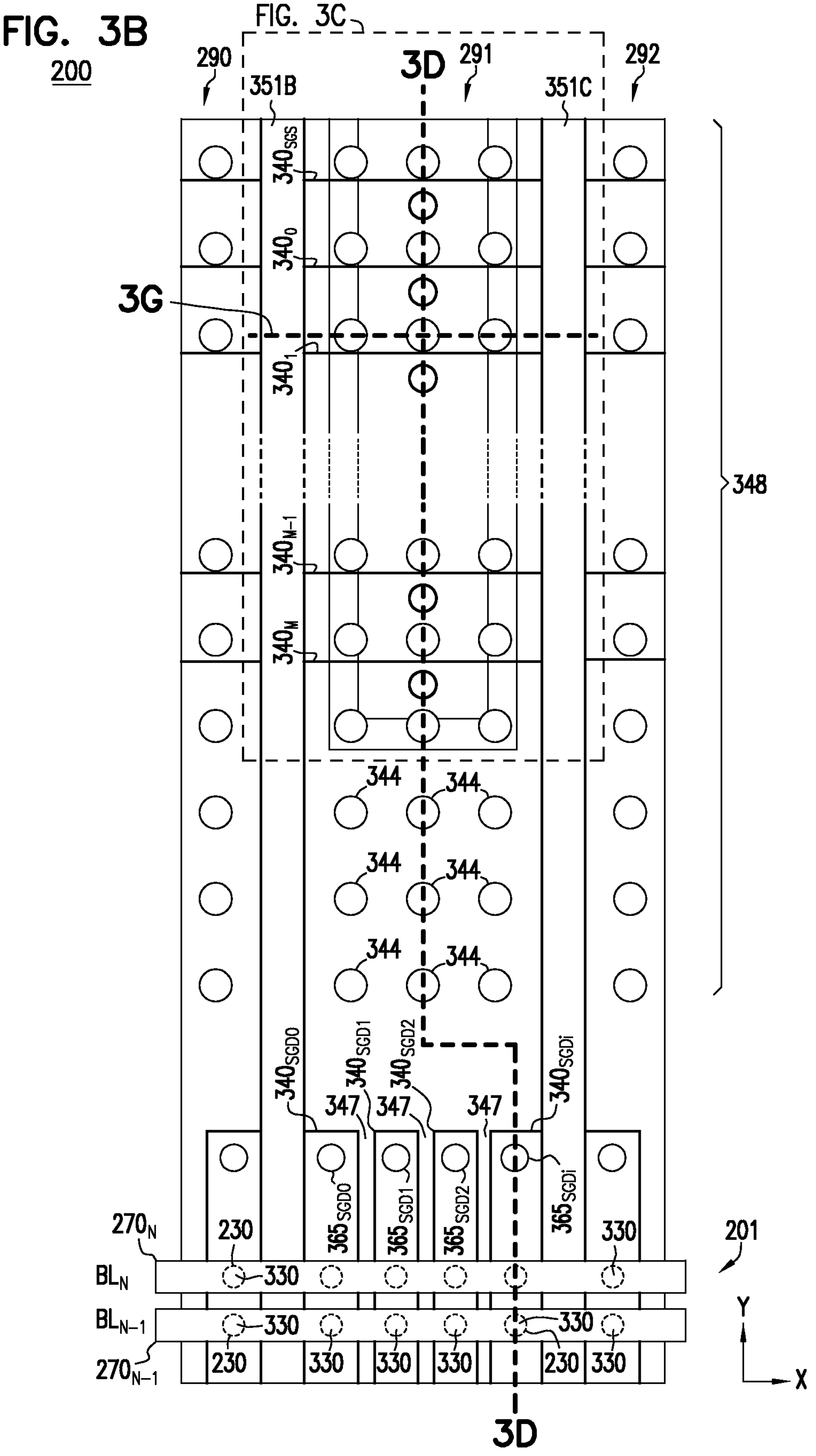
FIG. 3B shows detail of a portion of the memory device of FIG. 3A, according to some embodiments described herein.
FIG. 3C shows an enlarged portion of the memory device of FIG. 3B, according to some embodiments described herein.
Figure 3C:
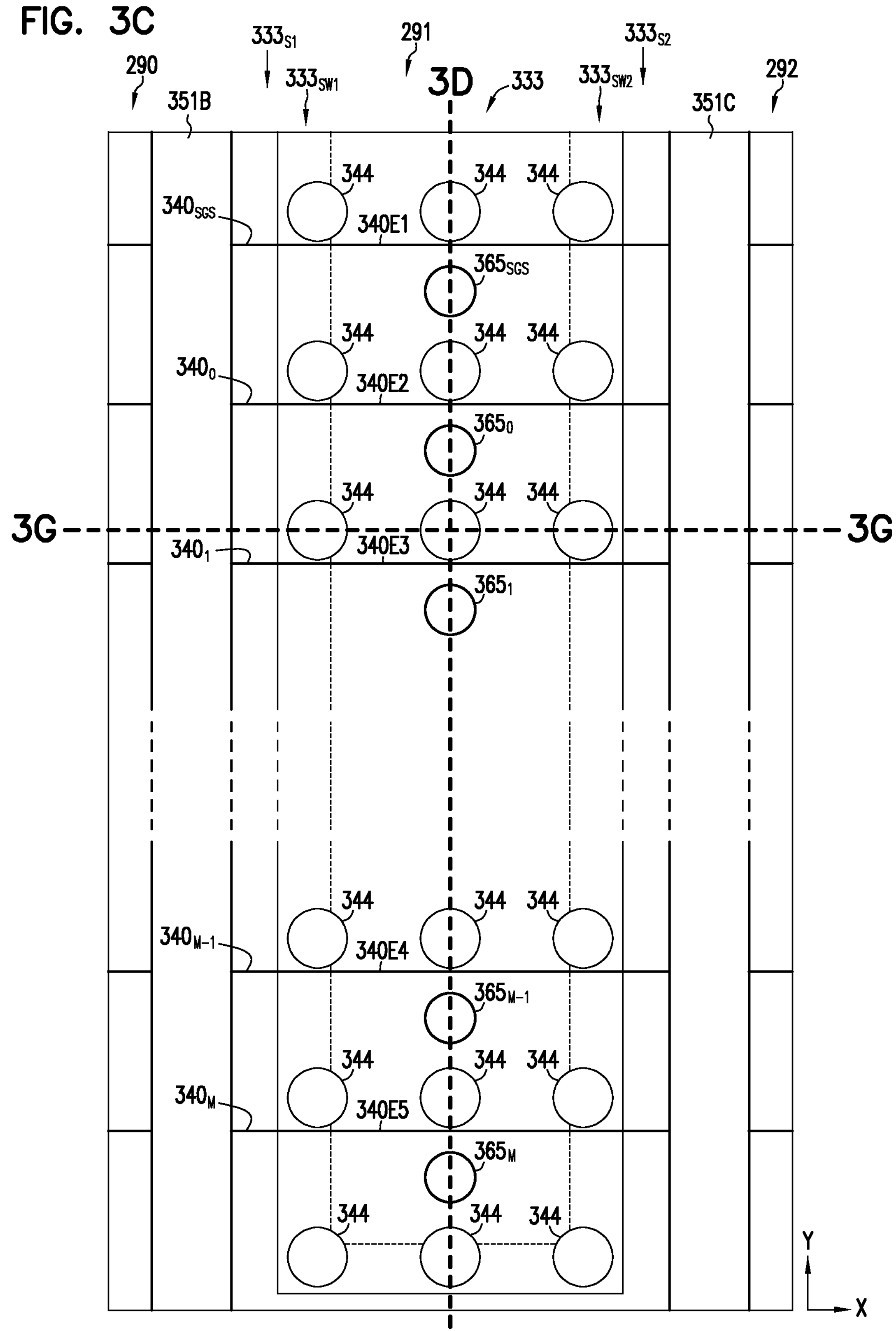
Figure 3D:
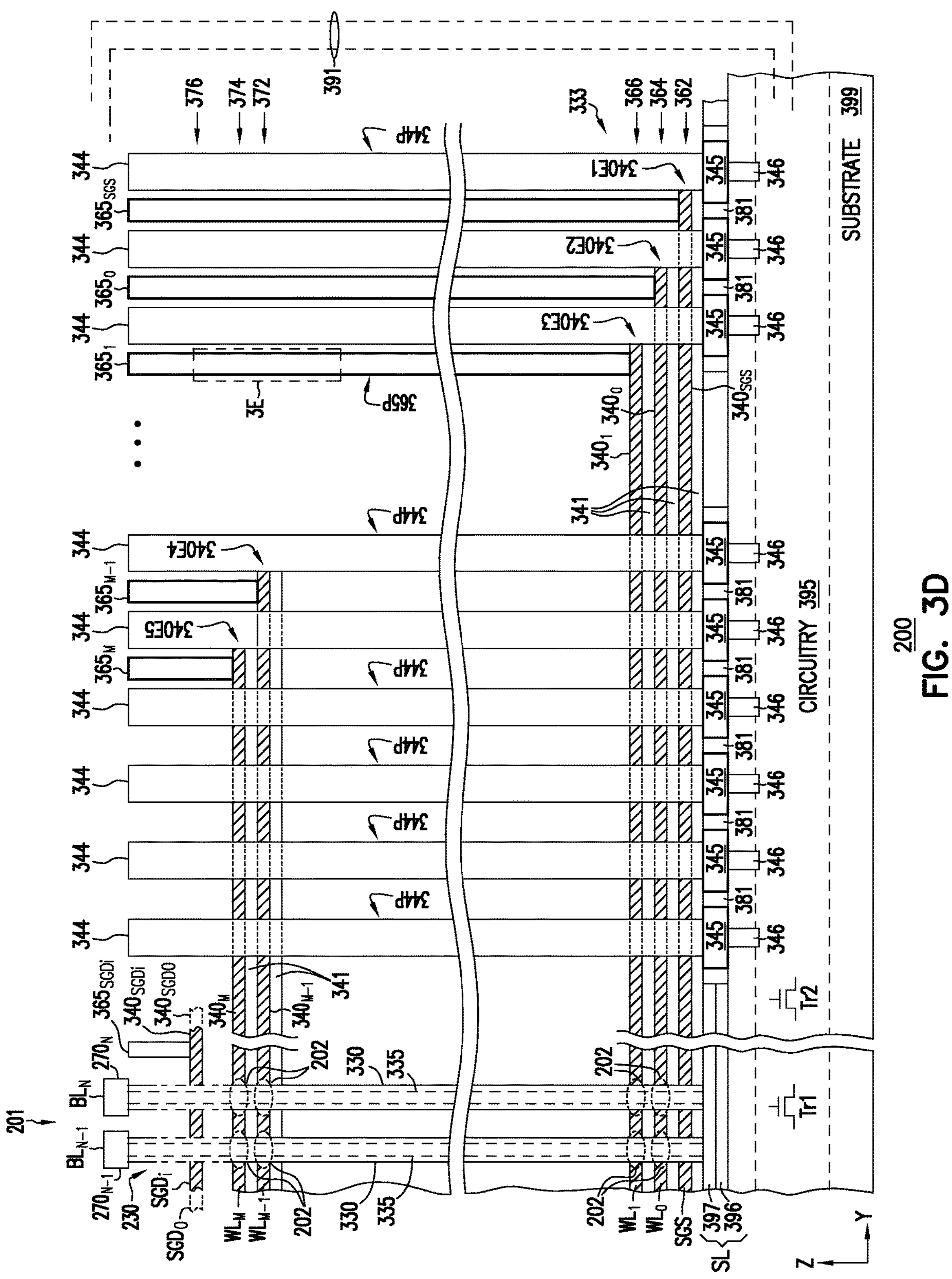
FIG. 3D shows detail of a portion (e.g., a side view) including a side view (in the Y-Z direction) of a staircase structure of the memory device of FIG. 3B, according to some embodiments described herein.
Figure 3F:
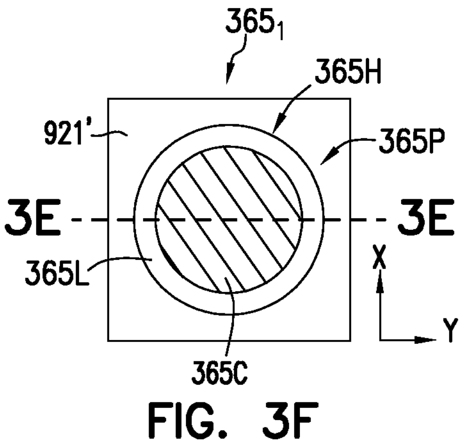
FIG. 3E and FIG. 3F show details (e.g., side view and top view, respectively) of a conductive contact (e.g., word line contact) of the memory device of FIG. 3D, according to some embodiments described herein.

In FIG. 3B, portion labeled "FIG. 3C" is shown in an enlarged view (with additional labels) in FIG. 3C. A portion (e.g., side view in the Y-Z direction) of memory device 200 along line 3D-3D in FIG. 3B and FIG. 3C is shown in FIG. 3D (described below). A portion (e.g., side view in the X-Z direction) of memory device 200 along line 3G-3G in FIG. 3B and FIG. 3C is shown in FIG. 3G (described below).

The following description refers to FIG. 3B and FIG. 3C. As shown in FIG. 3B, memory device 200 can include pillars 330 (shown in top view) in each of block 290, 291, and 292. Pillars 330 are memory cell pillars. The structure of pillars 330 is different from the structure of the pillars of contact structures 344 (described below) and the structure of the pillars of conductive contacts (e.g., conductive contacts $\mathbf{365}_{SGS}$, $\mathbf{365}_0$ through $\mathbf{365}_M$ (labeled in FIG. 3C) and $\mathbf{365}_{SGD0}$ through $\mathbf{365}_{SGDi}$) of memory device 200. Each pillar 330 (FIG. 3B) is part of a respective memory cell string 230 (also schematically shown in FIG. 2). Conductive contacts $\mathbf{365}_0$ through $\mathbf{365}_M$ can be called word line contacts (or local word line contacts). For simplicity, only conductive contacts $\mathbf{365}_0$, $\mathbf{365}_1$, $\mathbf{365}_{M-1}$, and $\mathbf{365}_M$ among conductive contacts $\mathbf{365}_0$ through $\mathbf{365}_M$ ($\mathbf{365}_0$-$\mathbf{365}_M$) are shown in FIG. 3B and FIG. 3C and other figures described herein. Conductive contacts between conductive contacts $\mathbf{365}_1$ through $\mathbf{365}_{M-1}$ are not shown.

As shown in FIG. 3B, pillars (memory cell pillars) 330 can be located under (below) and coupled to respective data lines (only data lines $\mathbf{270}_{N-1}$ and $\mathbf{270}_N$ are shown). Memory cells 202 of a memory cell string can be located (e.g., can be formed vertically) long the length (shown in FIG. 3G) of a corresponding pillar 330. Pillars 330 (and associated memory cell strings) of blocks 290, 291, and 292 can share data lines 270$_0$ through 270$_N$.

As shown in FIG. 3B, data lines 270$_0$ through 270$_N$ (associated with signals $BL_0$ through $BL_N$) of memory device 200 can be located over (above) pillars 330 (and over associated memory cell strings) in memory array 201. Data lines 270$_0$ through 270$_N$ can be coupled to respective pillars 330 (which are located under data lines 270$_0$ through 270$_N$ in the Z-direction).

As mentioned above, memory device 200 can include contact structures 344 in each of blocks 290, 291, and 292. For simplicity, FIG. 3B does not give labels for all contact structures 344. As shown in FIG. 3B and FIG. 3C, contact structures 344 can be located (e.g., can be formed) in respective rows in which each row can include many contact structures 344 in the Y-direction. FIG. 3B and FIG. 3C show block 291 including three rows (e.g., left, middle, and right rows parallel to the Y-direction) of contact structures 344 as an example, such that there can be three adjacent contact structures 344 in the X-direction (e.g., three contact structures 344 lining up in the X-direction). However, block 291 of memory device 200 can include a different number of rows of contact structures 344, such that the number adjacent contact structures 344 (e.g., that line up) in the X-direction can be different from three.

As shown in FIG. 3C, contact structures 344 and conductive contacts 365$_{SGS}$ and 365$_0$-365$_M$ can be adjacent each other. For example, one conductive contact (e.g., conductive contact 365$_0$) can be adjacent and between two contact structures 344. One contact structure 344 can be adjacent and between two contact structures (e.g., conductive contacts 365$_0$ and 365$_1$). FIG. 3B and FIG. 3C show block 291 including one row of conductive contacts 365$_{SGS}$ and 365$_0$-365$_M$ parallel to the Y-direction as an example. However, block 291 of memory device 200 can include a different number of rows of conductive contacts 365$_M$ parallel to the Y-direction.

As shown in FIG. 3B and FIG. 3C (e.g., viewing from a direction perpendicular to the X-Y plane (e.g., top view)), conductive contacts 365$_{SGS}$, 365$_0$-365$_M$, and 365$_{SGD0}$-365$_{SGDi}$ can have a circular shape. For example, the boundary of a cross-section (e.g., from a top view) of each conductive contact (e.g., conductive contact 365$_M$) has a circular boundary when viewed from a direction perpendicular to the X-Y plane.

FIG. 3B and FIG. 3C show an example where each of contact structures 344 can also have a circular shape. For example, the boundary of a cross-section (e.g., from a top view) of each contact structure 344 has a circular boundary when viewed from a direction perpendicular to the X-Y plane. However, the boundary of a cross-section of each of contact structures 344 can have a shape different from a circular shape. As an example, each of contact structures 344 can have an oval or oval-like shape, a rectangular or rectangular-like shape (e.g., rectangular having rounded corners), or other shapes.

As mentioned above, conductive contacts 365$_{SGS}$, 365$_0$-365$_M$, and 365$_{SGD0}$-365$_{SGDi}$ in FIG. 3B can be formed to provide electrical connections (e.g., signals) to respective select gates and control gates (e.g., select gates 280, 281$_0$ and 281$_i$ and control gates 250$_0$ through 250$_M$ of FIG. 2) of memory device 200.

Contact structures 344 in FIG. 3B can be formed to provide electrical connections (e.g., to form part of respective conductive paths) between circuitry (e.g., circuitry 395 in FIG. 3G) of memory device 200 and other elements of memory device 200.

As shown in FIG. 3B and FIG. 3C, memory device 200 can include conductive materials 340$_{SGS}$, 340$_0$ through 340$_M$, and 340$_{SGD0}$, 340$_{SGD1}$, 340$_{SGD2}$, and 340$_{SGDi}$ (340$_{SGD0}$ through 340$_{SGDi}$ or 340$_{SGD0}$-340$_{SGDi}$) in block 291 that can form (e.g., can be materials included in) respective select gate (e.g., source select gate) 280, control gates 250$_0$ through 250$_M$, and select gates (e.g., drain select gates) 280$_0$ and 280$_i$ (in FIG. 2). For simplicity, only conductive materials 340$_0$, 340$_1$, 340$_{M-1}$, and 340$_M$ among conductive materials 340$_0$ through 340$_M$ (340$_0$-340$_M$) are shown in FIG. 3B and other figures described herein.

In FIG. 3B, conductive materials (e.g., four separate conductive materials) 340$_{SGD0}$, 340$_{SGD1}$, 340$_{SGD2}$, and 340$_{SGDi}$ can form four respective drain select gates of block 291. The drain select gates formed by conductive materials 340$_{SGD1}$ and 340$_{SGD2}$ in FIG. 3B are not shown in FIG. 2. As shown in FIG. 3B, conductive materials 340$_{SGD0}$-340$_{SGDi}$ (FIG. 3B) can be electrically separated from each other by a gap 347 (which can be filled with a dielectric material (or materials)). For simplicity, FIG. 3B does not give labels for other conductive materials that form respective select gates and control gates of blocks 290 and 292.

The four conductive materials 340$_{SGD0}$, 340$_{SGD1}$ and 340$_{SGD2}$ and 340$_{SGDi}$ included in four respective drain select gates on the same level in block 291 can be associated with four respective sub-blocks of block 291. FIG. 3B shows an example of memory device 200 including four drain select gates in each block (e.g., block 291) formed by four corresponding conductive materials 340$_{SGD0}$, 340$_{SGD1}$, 340$_{SGD2}$, and 340$_{SGDi}$ on the same level (e.g., level 376 in FIG. 3D). However, the number of drain select gates on the same level in a block of memory device 200 can be different from four. For example, the number of drain select gates on the same level in a block can be based on (e.g., equal to) the number of sub-blocks in a block.

As shown in FIG. 3C, block 291 can include a staircase structure 333 (shown in top view in FIG. 3C). A side view (e.g., cross-section) of staircase structure 333 in the Y-Z direction is shown in FIG. 3D. Another side view (e.g., cross-section) of staircase structure 333 in the X-Z direction is shown in FIG. 3G. As shown in FIG. 3C, staircase structure 333 can include a side (e.g., left side) 333$_{S1}$ and a side (e.g., right side) 333$_{S2}$ opposite (e.g., in the X-direction) side 333$_{S1}$. Staircase structure 333 can include a sidewall (e.g., right sidewall) 333$_{SW1}$ on side 333$_{S1}$ and a sidewall (e.g., left sidewall) 333$_{SW2}$ on side 333$_{S2}$. Sidewalls 333$_{SW1}$ and 333$_{SW2}$ are opposite from each other in the X-direction. Each of sidewalls 333$_{SW1}$ and 333$_{SW2}$ can have a length perpendicular to the direction (the X-direction) of the width of block 291 and parallel to the direction (the Y-direction) of the lengths of dielectric structures 351B and 351C.

FIG. 3D shows a portion (e.g., side view in the Y-Z direction) of memory device 200 along line 3D-3D in FIG. 3B and FIG. 3C. As shown in FIG. 3D, memory device 200 can include levels 362, 364, 366, 372, 374, and 376 that are physical layers (e.g., portions) in the Z-direction of memory device 200. Conductive materials 340$_{SGS}$, 340$_0$-340$_M$, and 340$_{SGD0}$-340$_{SGDi}$ (also shown in top view in FIG. 3C) can be located (e.g., stacked) one level (e.g., one layer) over another in respective levels 362, 364, 366, 372, 374, and 376 (FIG. 3D) in the Z-direction. Conductive materials 340$_{SGS}$, 340$_0$-340$_M$, and 340$_{SGD0}$-340$_{SGDi}$ can also be called levels of conductive materials 340$_{SGS}$, 340$_0$-340$_M$, and 340$_{SGD0}$-340$_{SGDi}$. As shown in FIG. 3D, conductive materials 340$_{SGD0}$-340$_{SGDi}$ can be located on the same level (e.g., level 376).

Conductive materials 340$_{SGS}$, 340$_0$-340$_M$, and 340$_{SGDi}$ can interleave with dielectric materials 341 in the Z-direction. Conductive materials 340$_{SGS}$, 340$_0$-340$_M$, and 340$_{SGDi}$ can include metal (e.g., tungsten or other metal), other conductive materials, or a combination of conductive materials. Dielectric materials 341 can include silicon dioxide. Dielectric materials 341 can also be called levels of dielectric materials, which are formed to electrically separate (in the Z-direction) the control gates (formed by conductive materials 340$_0$-340$_M$) from each other and from other elements (e.g., source select gate and drain select gate) of memory device 200.

Signals SGS, $WL_0$, $WL_1$, $WL_{M-1}$, $WL_M$, $SGD_0$, and $SGD_i$ in FIG. 3D associated with respective conductive materials in FIG. 3D are the same signals shown in FIG. 2. Conductive material 340$_{SGS}$ in FIG. 3D can form select gate 280 (associated with signal SGS) of FIG. 2. Conductive materials 340$_0$-340$_M$ in FIG. 3D can form control gates 250$_0$ through 250$_M$ (associated with signals $WL_0$, $WL_1$, $WL_{M-1}$, and $WL_M$, respectively) of FIG. 2. Conductive material 340$_{SDG0}$ and 340$_{SGDi}$ (associated with signals $SGD_0$ and $SGD_i$) in FIG. 3D can form select gates 281$_0$ and 281$_i$, respectively, of FIG. 2.

FIG. 3D shows an example of memory device 200 including one level of conductive materials 340$_{SGS}$ that forms a select gate (e.g., source select gate associated with signal SGS). However, memory device 200 can include multiple levels (similar to level 362) of conductive materials (e.g., multiple levels of conductive material 340$_{SGS}$ located under (in the Z-direction) the level of conductive materials 340$_0$ (e.g., below level 364) to form multiple source select gates of memory device 200.

FIG. 3D shows an example of memory device 200 including one level (e.g., level 376) of multiple drain select gates (on the same level, formed by respective conductive materials 340$_{SGD0}$-340$_{SGDi}$). However, memory device 200 can include multiple levels (e.g., similar to level 376) in which each of such multiple levels can include multiple drain select gates (e.g., four drain select gates in each of the multiple levels).

Staircase structure 333 is partially shown in FIG. 3D for simplicity. For example, as shown in FIG. 3D, only a part of (e.g., upper (top) portion and lower (bottom) portion) of staircase structure 333 is shown in FIG. 3D. A middle part (e.g., middle portion) of staircase structure 333 is omitted from FIG. 3D.

As shown in FIG. 3D, respective portions (e.g., end portions) of conductive materials 340$_{SGS}$ and 340$_0$-340$_M$ and their respective edges (e.g., steps (or risers)) 340E1, 340E2, and 340E3, 340E4, and 340E5 can collectively form staircase structure 333. As shown in FIG. 3D, dielectric materials 341 can also include edges (not labeled) adjacent (e.g., aligned in the Z-direction with) respective edges 340E1, 340E2, and 340E3, 340E4, and 340E5. Thus, staircase structure 333 can also be formed in part by portions and edges (e.g., edges that are aligned with edges 340E1, 340E2, and 340E3, 340E4, and 340E5) of dielectric materials 341.

FIG. 3D also shows tiers of memory device 200 on respective levels 362, 364, 366, 372, 374, and 376. A tier of memory device 200 can include a level of conductive material (e.g., conductive material 340$_1$) and an adjacent level of dielectric material 341 (e.g., dielectric material 341 between conductive materials 340$_0$ and 340$_1$). As shown in FIG. 3D, the tiers can be located (e.g., stacked) one over another in the Z-direction over substrate 399 on respective levels 362, 364, 366, 372, 374, and 376.

FIG. 3D shows some of tiers of memory cells 202. Each tier of memory cells 202 can have respective memory cells 202 that are located on the same level (same tier) with respect to the Z-direction. For example, FIG. 3D shows four tiers of memory cells 202 located on four respective tiers (corresponding to four levels 364, 366, 372, and 374). Each tier of memory cells 202 can have a respective control gate (e.g., a respective word line) for memory cells 202 of the respective tier. The control gate in a tier is formed by a respective level of conductive material among conductive materials 340$_0$-340$_M$. In the example of FIG. 3D, there are four tiers of control gates (associated with signals $WL_0$, $WL_1$, $WL_{M-1}$, and $WL_M$) on respective levels 364, 366, 372, and 374 for four respective tiers of memory cells 202 on levels 364, 366, 372, and 374. FIG. 3D shows a few tiers (e.g., four tiers) of memory device 200 for simplicity. However, memory device 200 can include up to (or more than) one hundred tiers.

Other blocks (e.g., blocks 290 and 292 in FIG. 3B) of memory device 200 can also have their own tiers of memory cells 202 and respective control gates (e.g., respective word lines) for the memory cells. The other blocks can also have respective staircase structures similar to staircase structure 333 in block 291 in FIG. 3D. For simplicity, details of staircase structures of the other blocks of memory device 200 are omitted from the description herein.

As shown in FIG. 3D, memory device 200 can include a substrate 399 and materials 396 and 397 located over (e.g., formed over) substrate 399. Substrate 399 can include semiconductor (e.g., silicon) substrate. Substrate 399 can also include circuitry 395 located under other components (e.g., memory cells 202) that are formed over substrate 399. Circuitry 395 can include circuit elements (e.g., transistors Tr1 and Tr2 shown in FIG. 3D) coupled to circuit elements formed in memory device 200 and outside substrate 399. The circuit elements that are formed outside (e.g., formed over) substrate 399 can include data lines 270$_0$ through 270$_N$ (shown in FIG. 3A) conductive contacts 365$_{SGS}$, 365$_0$-365$_M$, 365$_{SGD0}$ through 365$_{SGDi}$ (FIG. 3B), part of conductive paths 391 and other (not shown) conductive connections, and other circuit elements of memory device 200. Circuitry 395 can include numerous transistors. FIG. 3D symbolically shows such transistors as transistors Tr1 and Tr2 for simplicity. The circuit elements (e.g., transistors Tr1 and Tr2 and other elements) of circuitry 395 can be configured to perform part of a function of memory device 200. For example, transistors Tr1 and Tr2 can form or can be part of decoder circuits, driver circuits (e.g., drivers 140 in FIG. 1), buffers, sense amplifiers, charge pumps, and other circuitry of memory device 200.

As shown in FIG. 3D, conductive paths (e.g., conductive routings) 391 of memory device 200 can include portions extending in the Z-direction (e.g., extending vertically). Conductive paths 391 can include (e.g., can be coupled to) some of the conductive contacts (e.g., conductive contacts 365$_{SGS}$, 365$_1$-365$_M$, and 365$_{SGD0}$-365$_{SGDi}$ in FIG. 3B) or all of the conductive contacts of memory device 200. As shown in FIG. 3D, conductive paths 391 can be coupled to circuitry 395. For example, at least one of conductive paths 391 can be coupled to at least one of transistors Tr1 and Tr2 of circuitry 395.

Conductive paths 391 can provide electrical connections between elements of memory device 200. For example, conductive paths 391 can be coupled to conductive contacts 365$_{SGS}$, 365$_0$-36$_{M-1}$, and 365$_{SGD0}$-365$_{SGDi}$ and circuit elements (e.g., word line drivers and word line decoders, SGD and SGS drivers, and charge pumps, not shown) of circuitry 395 to provide electrical connections (e.g., in the form of signals $WL_0$ through $WL_M$, and $SGD_0$ through $SGD_i$, and SGS) from such circuit elements in circuitry 395 to respective conductive contacts $365_0$-$365_M$, $365_{SGD0}$-$365_{SGDi}$, and $365_{SGS}$).

As shown in FIG. 3D, conductive contacts $365_{SGS}$ and $365_0$-$365_M$ can include pillars (e.g., conductive pillars) that can have different lengths extending in the Z-direction (e.g., extending vertically (e.g., outward) from substrate 399). For simplicity, FIG. 3D shows a label for pillar 365P for only one of conductive contacts $365_0$-$365_M$. A portion of conductive contact $365_1$ labeled "FIG. 3E" is described in detail below with reference to FIG. 3E.

In FIG. 3D, each of conductive contacts $365_{SGS}$ and $365_0$-$365_M$ (including a respective pillar) can include a conductive material that contacts (e.g., land on) a respective level of a particular conductive material (among conductive materials $340_{SGS}$ and $340_0$-$340_M$) at the location of staircase structure 333. Each conductive contact $365_{SGS}$ and $365_0$-$365_M$ can form an electrical contact with a respective conductive material (among conductive materials $340_{SGS}$ and $340_0$-$340_M$). Thus, conductive contacts $365_{SGS}$, $365_0$-$365_M$ (and $365_{SGD0}$-$365_{SGDi}$ shown in FIG. 3B) can be part of conductive paths (e.g., part of conductive paths 391) to carry electrical signals to the select gate (e.g., source select gate associated with signal SGS), the control gates (e.g., control gates associated with signals $WL_M$ and $WL_{M-1}$) and other select gates (e.g., drain select gates associated with signals $SGD_0$-$SGD_i$), respectively.

As shown in FIG. 3D, conductive contact $365_{SGS}$ is electrically in contact with conductive materials $340_{SGS}$ and electrically separated from the rest of conductive materials (e.g., conductive materials $340_0$-$340_M$ and $340_{SGD0}$-$340_{SGSi}$). Conductive contact $365_0$ is electrically in contact with conductive materials $340_0$ and electrically separated from the rest of conductive materials (e.g., conductive materials $340_{SGS}$, $340_1$, $340_{M-1}$, $340_M$, and $340_{SGSi}$). Conductive contact $365_1$ is electrically in contact with conductive materials $340_1$ and electrically separated from the rest of conductive materials (e.g., conductive materials $340_{SGS}$, $340_0$, $340_{M-1}$, $340_M$, and $340_{SGSi}$). Thus, a conductive contact (e.g., conductive contact $365_0$) can be electrically in contact with only one of the conductive materials among the conductive materials (e.g., conductive materials $340_{SGS}$, $340_0$-$340_M$, and $340_{SGS0}$-$340_{SGDi}$ in FIG. 3D) of memory device 200.

Materials 396 and 397 shown in FIG. 3D can be part of source (e.g., source structure or source region) 298 shown in FIG. 2. Materials 396 and 397 can include different conductive materials. An example of material 396 includes tungsten silicide (or other conductive materials). An example of material 397 includes polysilicon. Materials 396 and 397 can include other conductive materials. Material 397 can include a single level (e.g., a single layer) of material in the Z-direction. For example, material 397 can include a single level (e.g., a single layer) of polysilicon. Alternatively, material 397 can include multiple levels (e.g., layers) of materials in the Z-direction. For example, material 397 can include levels (e.g., layers) of polysilicon interleaved with levels (e.g., layers) of oxide (e.g., silicon dioxide). Materials 396 and 397 can be part of electrical connections (e.g., lateral connections (e.g., a conductive plate) in the X-direction or the Y-direction) between elements of memory device 200 in circuitry 395. As shown in FIG. 3D, materials 396 and 397 can form an electrical contact with pillars (memory cell pillars) 330 of memory cell strings 230.

As shown in FIG. 3D, each pillar (memory cell pillar) 330 can include a structure 335 extending along the length (in the Z-direction) of pillar 330 and coupled to a respective data line (e.g., data line $270_{N-1}$ or $270_N$) and the source (which includes materials 396 and 397) of memory device 200. Structure 335 can include a conductive channel portion that can be part of a conductive path between a respective data line (e.g., data line $270_N$) and the source (e.g., includes materials 396 and 397) to carry current (e.g., current between data line $270_N$ and materials 396 and 397) during an operation (e.g., read, write, or erase) of memory device 200.

Structure 335 of pillar 330 can include multiple layers of different materials that can be part of a TANOS (TaN, $Al_2O_3$, $Si_3N_4$, $SiO_2$, Si) structure of pillar 330 or a structure similar to a TANOS structure. For example, structure 335 can include a dielectric portion (e.g., interpoly dielectric portion). The dielectric portion can include a charge blocking material or materials (e.g., a dielectric material including TaN and $Al_2O_3$) that can block a tunneling of a charge. Structure (e.g., TANOS structure) 335 can include a charge storage portion. The charge storage portion can include a charge storage element (e.g., charge storage material or materials, e.g., $Si_3N_4$) that can provide a charge storage function (e.g., trap charge) to represent a value of information stored in a respective memory cell 202. Structure (e.g., TANOS structure) 335 can include another dielectric portion (where the charge storage portion can be between the dielectric portions) that can include a tunnel dielectric material or materials (e.g., $SiO_2$). The tunnel dielectric material (or materials) can allow tunneling of a charge (e.g., electrons). In an alternative structure of memory device 200, structure 335 of pillar 330 can include or can be part be part of a SONOS (Si, $SiO_2$, $Si_3N_4$, $SiO_2$, Si) structure. In another alternative structure of memory device 200, structure 335 of pillar 330 can include or can be part of a floating gate structure. For example, structure 335 can include a charge storage portion that can include polysilicon (or other material) that can be part of a floating gate of a respective memory cell 202.

As shown in FIG. 3D, contact structures 344 can include respective pillars 344P that have lengths extending in the Z-direction (e.g., extending vertically (e.g., outward) from substrate 399). Contact structures 344 (including pillars 344P) can have the same length. Contact structures 344 can go through a respective portion of (e.g., go through respective holes in the tiers of) conductive materials $340_{SGS}$ and $340_0$-$340_M$ and dielectric materials 341. Thus, pillars 344P of contact structures 344 can be formed in holes in the tiers of memory device 200. Contact structures 344 are electrically separated from (not electrically coupled to) conductive materials $340_{SGS}$ and $340_0$-$340_M$. Detailed description of contact structures 344 is included below with reference to FIG. 3G and FIG. 3H.

As shown in FIG. 3D, memory device 200 can include conductive islands 345 formed under (formed below in the Z-direction) and electrically coupled to respective contact structures 344. Conductive islands 345 can be electrically separated (e.g., laterally separated) from each other by a dielectric material 381. Conductive islands 345 can be coupled to respective pillars 344P of contact structures 344. Conductive islands 345 can also be coupled to respective conductive portions 346. Conductive portions 346 can be coupled to other elements (e.g., transistors Tr1 and Tr2) of circuitry 395. Thus, contact structures 344 can form electrical connections with circuitry 395 through respective pillars 344P, conductive islands 345, and conductive portions 346. Conductive islands 345 can be part of source 298

(which includes materials 396 and 397). For example, each conductive island 345 can include a separate portion of source 298. Thus, each conductive island 345 include a portion of materials 396 and 397.

Figure 3E:
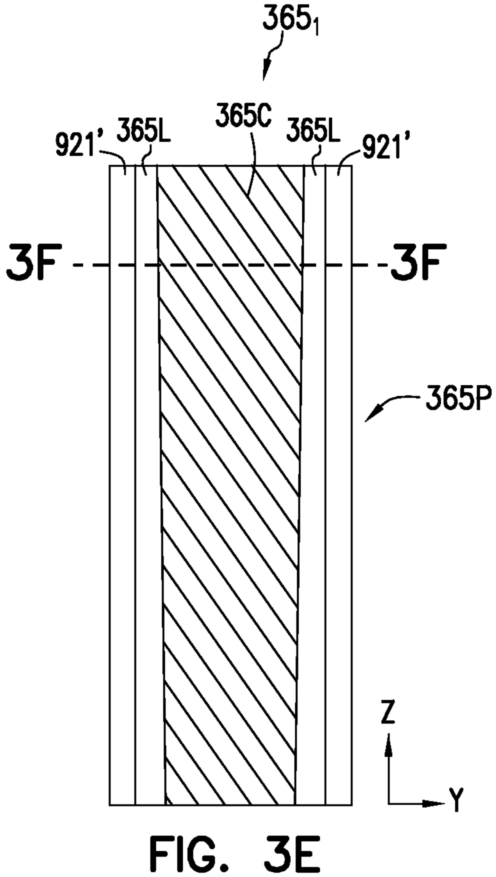
Figure 3G:
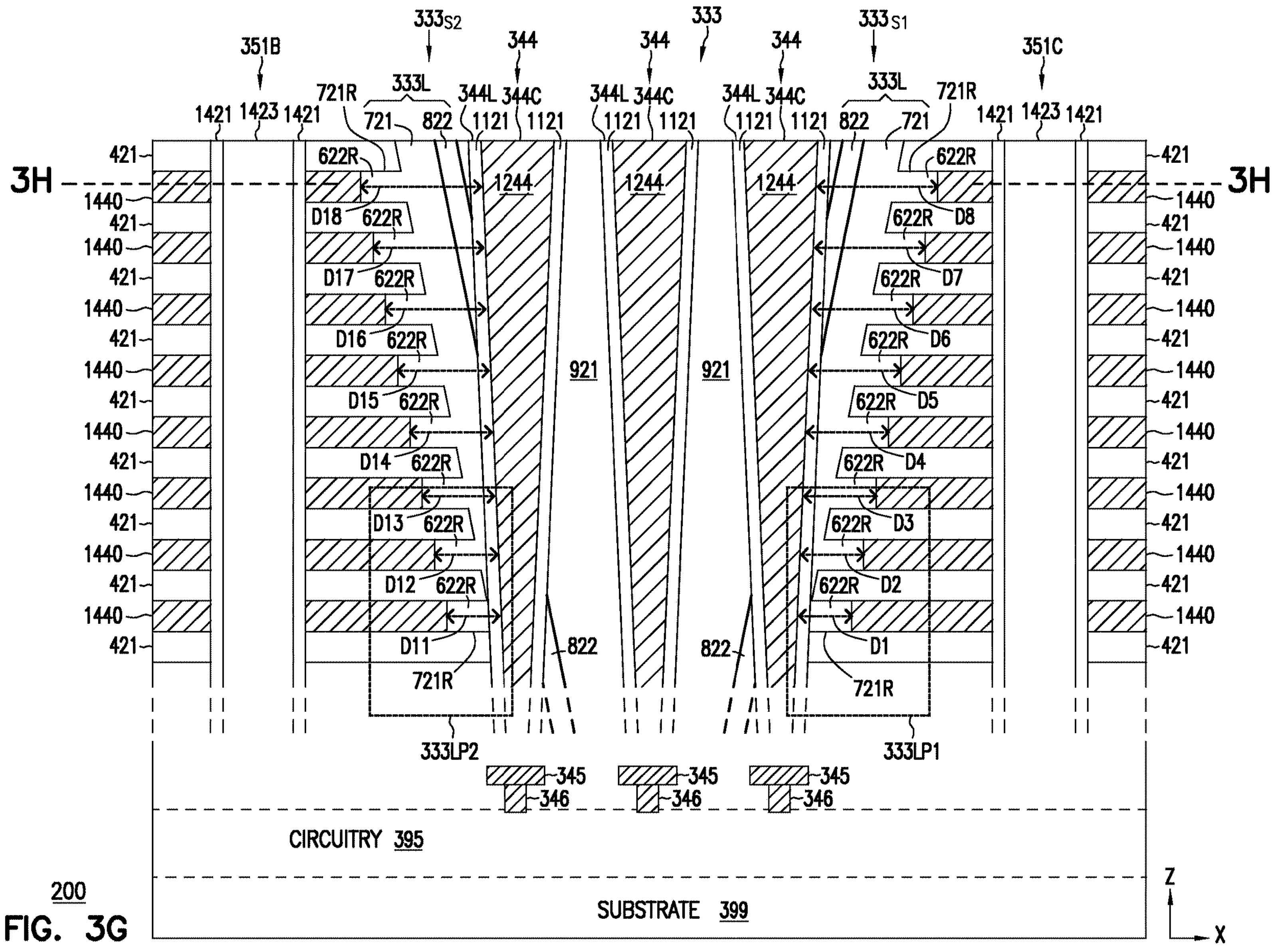
FIG. 3G and FIG. 3H show details (e.g., side view and top view, respectively) of a portion including another view (in the X-Z direction) of the staircase structure of device of FIG. 3B, according to some embodiments described herein.

FIG. 3E shows detail of a portion (e.g., a side view (a cross-section)) of a conductive contact $\mathbf{365}_1$ including pillar 365P. FIG. 3F shows a top view (e.g., a cross-section parallel to the X-Y plane) along line 3F-3F of FIG. 3E. The following description refers to FIG. 3E and FIG. 3F. As shown in FIG. 3E, pillar 365P can include a dielectric liner portion 365L and a core portion (conductive core portion) 365C. Core portion 365C is adjacent dielectric liner portion 365L (e.g., interfaces with an inner surface of dielectric liner portion 365L). As shown in FIG. 3F, core portion 365C can be surrounded by dielectric liner portion 365L with respect to the top view (e.g., X-Y plane view). With respect to the view (e.g., side view) shown in FIG. 3E, at least a portion (e.g., left and right portions) of core portion 365C can be surrounded (e.g., surrounded on the left and right sides) by dielectric liner portion 365L. Dielectric liner portion 365L can include an oxide material (e.g., silicon dioxide). Core portion 365C is a conductive structure that includes a conductive material. The conductive material can include metal (e.g., tungsten), an alloy, or combination (e.g., different layers) of metal and alloy. As shown in FIG. 3F, core portion 365C and dielectric liner portion 365L can be formed in an opening (e.g., a hole) 365H. Opening 365H can be formed in a dielectric material (e.g., silicon dioxide) 921' (FIG. 3E and FIG. 3F). Dielectric material 921' can be part of dielectric material 921 (e.g., FIG. 3G) that is formed during the process of forming contact structures 344 (described below with reference to FIG. 4 through FIG. 15).

Figure 3H:
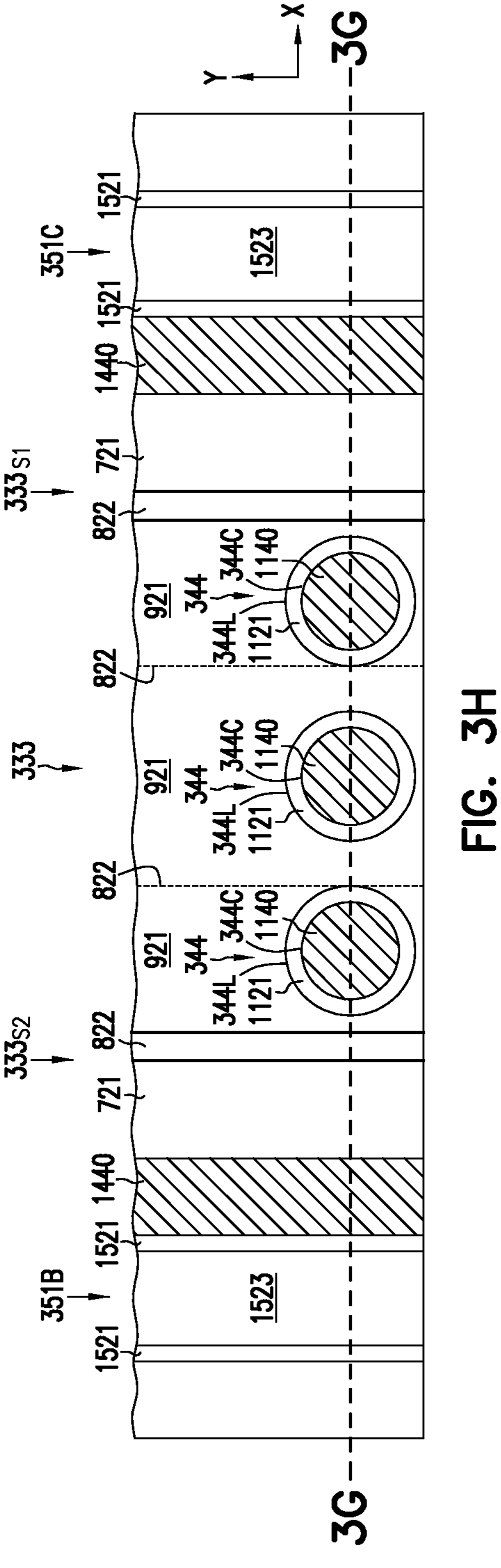

FIG. 3G shows a portion (e.g., side view in the X-Z direction) of memory device 200 along line 3G-3G in FIG. 3B and FIG. 3C. Staircase structure 333 (in the X-Z direction) in FIG. 3G is the same as staircase structure 333 shown in a top view (in the X-Y direction) in FIG. 3B and FIG. 3C. A side view (in the Y-Z direction) of staircase structure 333 is shown in FIG. 3D. In FIG. 3G, a portion (e.g., with respect to a top view) of memory device 200 along line 3H-3H is shown in FIG. 3H. The following description refers to FIG. 3G and FIG. 3H.

In FIG. 3G, conductive materials (levels of conductive material in different tiers) 1440 can be part of (e.g., can correspond to) some or all of the conductive materials (e.g., conductive materials $\mathbf{340}_{SGS}$ and $\mathbf{340}_0$ through $\mathbf{340}_M$ in FIG. 3D) of memory device 200. Thus, conductive materials 1440 can form part of the control gates (e.g., the control gates associated with signals $WL_0$ through $WL_M$ shown in the Y-Z direction in FIG. 3D) memory device 200.

As shown in FIG. 3G and FIG. 3H, each of dielectric structures 351B and 351C can include a material (e.g., a liner) 1421 and a material 1423 (which can be another dielectric material or other non-conductive materials). For example, materials 1421 and 1423 can include any combination of silicon dioxide, silicon nitride, or other materials.

Staircase structure 333 can include a dielectric liner 333L on each of sides $\mathbf{333}_{S1}$ and $\mathbf{333}_{S2}$. Dielectric liner 333L can include a dielectric material 721 and a dielectric material 822 adjacent (e.g., formed on) dielectric material 721. Dielectric materials 721 and 822 can include different dielectric materials. In an example, dielectric material 721 includes an oxide material (e.g., silicon dioxide material). In an example, dielectric material 822 includes a nitride material (e.g., silicon nitride material).

Dielectric liner 333L on side $\mathbf{333}_{S1}$ can be part of sidewall $\mathbf{333}_{SW1}$ (labeled in FIG. 3C) of staircase structure 333 in which the sidewall has a slope M1. Dielectric liner 333L on side $\mathbf{333}_{S2}$ can be part of sidewall $\mathbf{333}_{SW2}$ (labeled in FIG. 3C) of staircase structure 333 in which the sidewall has a slope M2. Thus, as shown in FIG. 3G, dielectric liner 333L on side $\mathbf{333}_{S1}$ can have a cross-section (e.g., a cut along line 3G-3G in FIG. 3C) where respective portions of dielectric materials 721 and 822 have a slope M1. Similarly, dielectric liner 333L on side $\mathbf{333}_{S2}$ can have a cross-section (e.g., a cut along line 3G-3G in FIG. 3C) where respective portions of dielectric materials 721 and 822 have a slope M2. Slopes M1 and M2 can be based on slopes M1' and M2', respectively, of opening 533 of FIG. 5A and FIG. 5B.

As shown in FIG. 3G, each of sides $\mathbf{333}_{S1}$ and $\mathbf{333}_{S2}$ can include recesses 622R on respective tiers (the tiers that include corresponding conductive materials 1440). Each recess 622R is cavity formed by (e.g., bordered by) part of a respective conductive material 1440 and part of dielectric materials 421 adjacent the respective conductive material 1440.

Part of dielectric material 721 on side $\mathbf{333}_{S1}$ can be located in (e.g., formed in) recesses 622R on side $\mathbf{333}_{S1}$. For example, as shown in FIG. 3G, dielectric material 721 on side $\mathbf{333}_{S1}$ can include portions (e.g., silicon dioxide) 721R located in respective recesses 622R on side $\mathbf{333}_{S1}$. Similarly, part of dielectric material 721 on side $\mathbf{333}_{S2}$ can be located in (e.g., formed in) recesses 622R on side $\mathbf{333}_{S2}$, such that dielectric material 721 on side $\mathbf{333}_{S2}$ can include portions (e.g., silicon dioxide) 721R located in respective recesses 622R on side $\mathbf{333}_{S2}$. For simplicity, only a few of portions 721R in recesses 622R on sides $\mathbf{333}_{S1}$ and $\mathbf{333}_{S2}$ are labeled in FIG. 3G.

As shown in FIG. 3G and FIG. 3H, each contact structure 344 can include a dielectric liner 344L and a conductive core 344C adjacent dielectric liner 344L. As shown in FIG. 3H, conductive core 344C can be surrounded by dielectric liner 344L with respect to the top view (e.g., X-Y plane view). With respect to the view (e.g., side view) shown in FIG. 3G, at least a portion (e.g., left and right portions) of conductive core 344C can be surrounded (e.g., surrounded on the left and right sides) by dielectric liner 344L. Dielectric liner 344L can include an oxide material (e.g., silicon dioxide). Conductive core 344C is a conductive structure that includes a conductive material.

As shown in FIG. 3G and FIG. 3H, dielectric liner 344L can include a dielectric material 1121. In an example, dielectric material 1121 can include silicon dioxide (e.g., a single layer of silicon dioxide). In another example, dielectric material 1121 can include multiple layers of different dielectric materials (e.g., a silicon dioxide layer and another layer of dielectric material different from silicon dioxide).

Conductive core 344C can include a conductive material (or materials) 1244. In an example, conductive material 1244 can include metal (e.g., a single metal material (e.g., tungsten or other metals)) or other conductive materials. In another example, conductive material 1244 can include an alloy. In another example, conductive material 1244 can include a combination (e.g., different layers) of metal and alloy.

As shown in FIG. 3G, contact structures 344 can be formed (e.g., vertically formed) at different locations at staircase structure 333. For example, two of contact structures 344 (e.g., outer contact structures) can be formed on (e.g., adjacent) respective sides $\mathbf{333}_{S1}$ and $\mathbf{333}_{S2}$. One of contact structures 344 can be formed between (e.g., in the middle) of the two outer contact structures.

As shown in FIG. 3G and FIG. 3H, staircase structure 333 can include a dielectric material 921 formed in a region between sides $333_{S1}$ and $333_{S2}$ of staircase structure 333. Each contact structure 344 can be formed in an opening (e.g., hole) in dielectric material 921. As shown in FIG. 3G, each contact structure 344 can also be formed through part of a respective dielectric liner 333L on a side $333_{S1}$ or $333_{S2}$.

In FIG. 3G, dimensions D1 through D8 indicate distances (e.g., in nanometer units in the X-direction) between conductive core 344C of contact structure 344 on side $333_{S1}$ and respective conductive materials 1440 on side $333_{S1}$.

Similarly, dimensions D11 through D18 indicate distances (e.g., in nanometer units in the X-direction) between conductive core 344C of contact structure 344 on side $333_{S2}$ and respective conductive materials 1440 on side $333_{S2}$.

As shown in FIG. 3G, regions 333LP1 and 333LP2 on respective sides $333_{S1}$ and $333_{S2}$ also have recesses 622R and portions 721R like other portions (e.g., top portions) of dielectric liners 333L. The improvements and benefits of dielectric liners 333L are described below.

In memory device 200, dielectric liners 333L are formed to electrically separate the control gates (formed by conductive materials 1440) from respective contact structures (e.g., outer contact structure) 344 on sides $333_{S1}$ and $333_{S2}$. Dielectric liners 333L can be formed with certain dimensions (e.g., dimensions D1 through D8 and D11 through D18) to allow memory device 200 to meet certain electrical properties (e.g., electric field, breakdown voltage, or both) associated with conductive materials 1440 and conductive cores 344C of respective contact structures 344 on sides $333_{S1}$ and $333_{S2}$. In FIG. 3G, dielectric liners 333L are formed with recesses 622R and portions 721R to provide additional separation between conductive materials 1440 and conductive cores 344C of respective contact structures 344 on sides $333_{S1}$ and $333_{S2}$ to further improve the mentioned electrical properties. This in turn can further improve (e.g., increase) the reliability and performance of memory device 200.

The structure of memory device 200 including dielectric liners 344L can have improvements and benefits in comparison with some alternative structures. For example, if dielectric liner 333L is not included (not formed) in memory device 200, separation between conductive materials 1440 (FIG. 3G) and conductive cores 344C of respective contact structures 344 on sides $333_{S1}$ and $333_{S2}$ may not be sufficient provided proper electrical properties associated with conductive materials 1440 and conductive cores 344C of respective contact structures 344 on sides $333_{S1}$ and $333_{S2}$. This can reduce the reliability and performance of memory device 200. In another example, if some of recesses 622R and portions 721R of dielectric liner 333L (FIG. 3G) are not formed in some regions (e.g., regions 333LP1 and 333LP2) of staircase structure 333, electrical properties associated with conductive materials 1440 and conductive cores 344C at such regions may be impacted. This can also reduce the reliability and performance of memory device 200. Thus, the inclusion of recesses 622R and portions 721R of dielectric liner 333L at regions 333LP1 and 333LP2 of staircase structure 333 further allow memory device 200 to maintain and improve electrical properties associated with conductive materials 1440 and conductive cores 344C at regions 333LP1 and 333LP2 of staircase structure 333.

As described above, conductive materials 1440 in FIG. 3G can be part of (e.g., can correspond to) the control gates (e.g., all the control gates associated with signals $WL_0$ through $WL_M$ in FIG. 3D) of memory device 200. For example, the bottom-most conductive material 1440 in FIG. 3G can be part of the control gate associated with signal $WL_0$ in FIG. 3D. The top-most conductive material 1440 in FIG. 3G can be part of the control gate associated with signal $WL_M$ in FIG. 3D.

Referring to the view of memory device 200 in the Y-Z direction FIG. 3D, among the tiers where the control gate associated with signals $WL_0$ through $WL_M$ are located, the tier where the control gate associated with $WL_M$ is located is the tier closest to data lines $270_0$ through $270_N$ (with respect to the Z-direction). Thus, in the view of memory device 200 in the X-Z direction FIG. 3G, a recess 622R and a respective portion 721R are also formed in the tier (e.g., top-most tier in FIG. 3G) having a control gate that is closest to the data lines $270_0$ through $270_N$ (with respect to the Z-direction). As shown in FIG. 3G, a recess 622R and a respective portion 721R can also formed in each of (e.g., all of) the tiers below (adjacent) the top-most tier (e.g., the tier having control gate (FIG>3D) that is closest to the data lines $270_0$ through $270_N$).

Thus, in this example, dielectric liners 333L in FIG. 3G are formed such that recesses 622R and portions 721R are formed between each of (e.g., all of) the control gates along the length (in the Z-direction) and contact structures 344 on respective sides $333_{S1}$ and $333_{S2}$. This allows each of the control gates (e.g., all of the control gates) along the length of contact structures 344 (including portions of regions 333LP1 and 333LP2 of staircase structure 333 at regions 333LP1 and 333LP2) to have enough separation from contact structures 344 on respective sides $333_{S1}$ and $333_{S2}$. This in turn can maintain and improve (e.g., increase) the reliability and performance of memory device 200. Further, the inclusion of recesses 622R and portions 721R allow dielectric liner 344L of respective contact structure 344 to be relatively thin, which can relax critical dimension (CD) requirements, which in turn can improve array efficiency.

The improvements and benefits in the structure of memory device 200 including dielectric liners 344L, as described above with reference to FIG. 2 through FIG. 3H, can result from part of the processes described below with reference to FIG. 4 through FIG. 15.

FIG. 4 through FIG. 15 show different views of structures during processes of forming memory device 200 of FIG. 2 through FIG. 3H, according to some embodiments described herein. The locations of the structure (e.g., side views) of memory device 200 in FIG. 4 through FIG. 15 can correspond to the location (e.g., side view of memory device 200) along line 3G-3G at staircase structure 333 in FIG. 3C.

Figure 4:
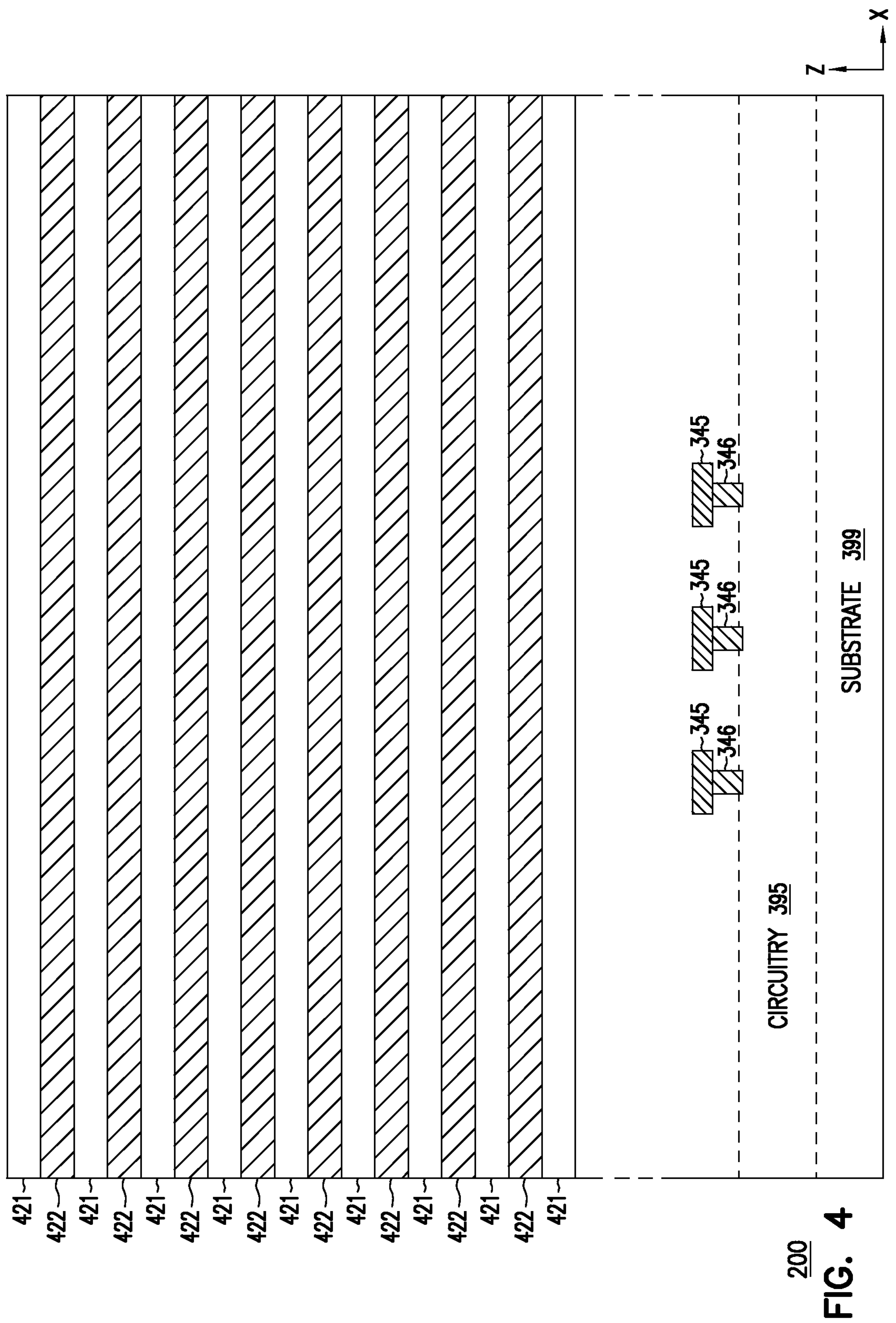
FIG. 4 through FIG. 15 show different views of structures during processes of forming the memory device of FIG. 2 through FIG. 3H, according to some embodiments described herein.

FIG. 4 shows memory device 200 after conductive islands 345 and conductive portions 346 are formed over substrate 399. Conductive islands 345 can be electrically coupled to elements of circuitry 395 (as described above with reference to FIG. 3D) through conductive portions 346. As described below, contact structures 344 can be subsequently formed over respective conductive islands 345 and coupled to circuitry 395 through conductive islands 345 and conductive portions 346. The processes associated with FIG. 4 can also form materials 396 and 397 (not shown) of source 298 (FIG. 3D) over substrate 399.

FIG. 4 also shows dielectric materials 421 and dielectric materials 422 formed over conductive islands 345 and conductive portions 346. Dielectric materials 421 can include silicon dioxide. Dielectric materials 422 can include silicon nitride. Dielectric materials 421 and dielectric materials 422 can be formed such that dielectric materials 421 can interleave with dielectric materials 422 on respective levels (e.g., respective tiers) of memory device 200 in the Z-direction. Thus, dielectric materials 421 can be called levels of dielectric materials 421. Dielectric materials 422 can be called levels of dielectric materials 422. Dielectric materials 421 and dielectric materials 422 can be sequentially formed (e.g., deposited) one material after another over substrate 399 in an interleaved fashion. Thus, the processes associated with FIG. 4 can include forming levels of dielectric materials (e.g., dielectric materials 421) interleaved with levels of additional dielectric materials (e.g., dielectric materials 422). For simplicity, FIG. 4 omits (does not show) part of memory device 200 between conductive islands 345 and dielectric materials 421 and 422.

Dielectric materials 421 (in the X-Z view in FIG. 4) can correspond to dielectric materials 341 (in Y-Z view in FIG. 3D) between respective control gates (e.g., control gates associated signals $WL_0$-$WL_M$ in FIG. 3D) of memory device 200. After memory device 200 is formed, dielectric materials 341 (FIG. 3D) are part of dielectric materials 421 of FIG. 4. Thus, the levels of dielectric materials 421 in FIG. 4 are formed to electrically separate (in the Z-direction) respective control gates (e.g., control gates associated signals $WL_0$-$WL_M$ in FIG. 3D) of memory device 200 from each other. The levels of dielectric materials 421 in FIG. 4 are also formed to electrically separate (in the Z-direction) the control gates from other elements (e.g., source select gate and drain select gate) of memory device 200.

Figure 5A:
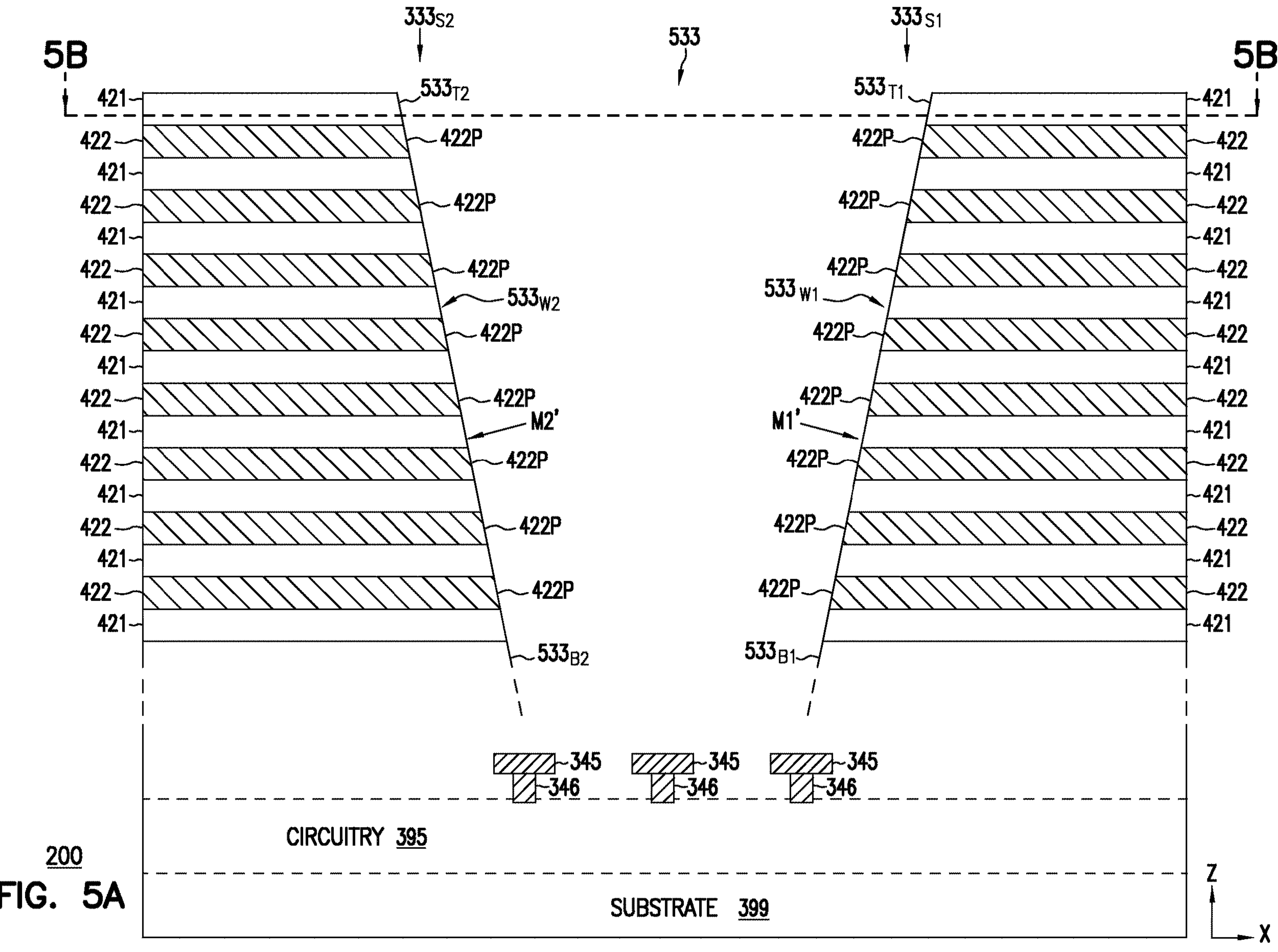
Figure 5B:
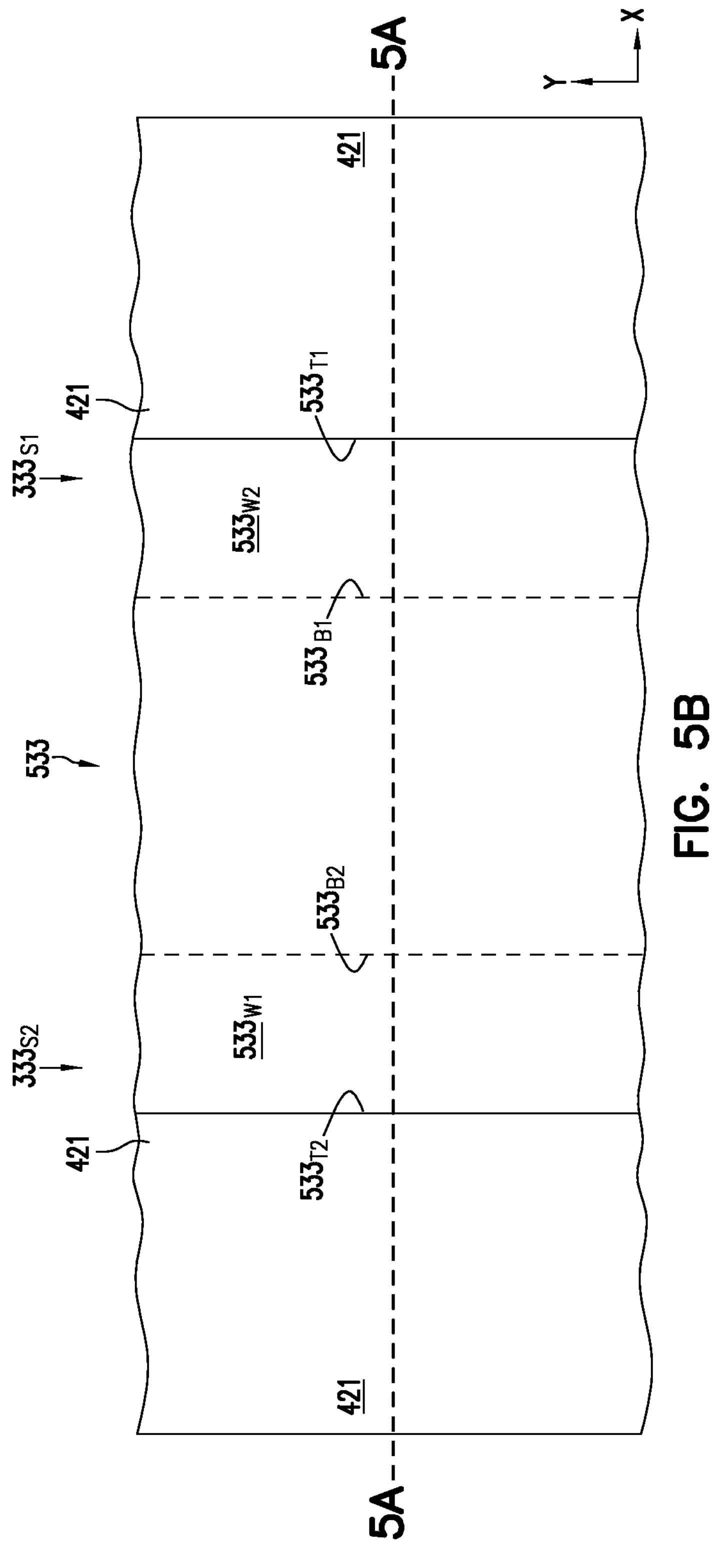

FIG. 5A and FIG. 5B shows memory device 200 after an opening (e.g., staircase opening or cavity) 533 is formed. FIG. 5B shows a portion of memory device 200 along line 5B-5B of FIG. 5A. Line 5A-5A in FIG. 5B shows the location corresponding to a side view of memory device 200 in FIG. 5A.

Forming openings 533 can include removing (e.g., etching) part of dielectric materials 421 and part of dielectric material 422. Opening 533 can have a sidewall $\mathbf{533}_{W1}$ and a sidewall $\mathbf{533}_{W2}$ opposite from each other in the X-direction.

As shown in FIG. 5A, sidewall $\mathbf{533}_{W1}$ can include (e.g., can be formed from) respective portions of dielectric materials 421 and respective portions of dielectric materials 422 on side $\mathbf{333}_{S1}$. As shown in FIG. 5A dielectric materials 422 have respective portions (e.g., silicon nitride) 422P exposed at opening 533 on side $\mathbf{333}_{S1}$. Sidewall $\mathbf{533}_{W1}$ can be relatively Smooth (e.g., have no steps). Sidewall $\mathbf{533}_{W1}$ is a sloped (slanted) sidewall having a slope M1' (FIG. 5A). As shown in FIG. 5A and FIG. 5B, sidewall $\mathbf{533}_{W1}$ has a region (e.g., top region) $\mathbf{533}_{T1}$ and a region (e.g., bottom region) $\mathbf{533}_{B1}$. Slope M1' can be based on a line from region $\mathbf{533}_{T1}$ to region $\mathbf{533}_{B1}$. Sidewall $\mathbf{533}_{W1}$ is not parallel with the Z-direction, such that slope M1' can form an angle with a line parallel to the Z-direction.

Similarly, sidewall $\mathbf{533}_{W2}$ can include (e.g., can be formed from) respective portions of dielectric materials 421 and respective portions of dielectric materials 422 on side $\mathbf{333}_{S2}$. As shown in FIG. 5A dielectric materials 422 have respective portions 422P exposed at opening 533 on side $\mathbf{333}_{S2}$. As shown in FIG. and FIG. 5B, sidewall $\mathbf{533}_{W2}$ has a region (e.g., top region) $\mathbf{533}_{T2}$ and a region (e.g., bottom region) $\mathbf{533}_{B2}$. Sidewall $\mathbf{533}_{W2}$ is a sloped (slanted) sidewall having a slope M2' (FIG. 5A). Slope M2' can be based on a line from region $\mathbf{533}_{T2}$ to region $\mathbf{533}_{B2}$. Sidewall $\mathbf{533}_{W2}$ is not parallel with the Z-direction, such that slope M2' can form an angle with a line parallel to the Z-direction.

The processes associated with FIG. 5A and FIG. 5B can be part of forming staircase structure 333 of FIG. 3C and FIG. 3D. Thus, forming opening 533 can be part of forming staircase structure 333. For example, although not shown in FIG. 5A and FIG. 5B, the process associated with FIG. 5A and FIG. 5B can include forming edges (in the Y-Z direction) in dielectric materials 421 and 422. Such edges can correspond to edges 340E1 through 340E5 (in FIG. 3D). Thus, forming opening 533 in the processes associated with FIG. 5A and FIG. 5B can be part of forming staircase structure 333 (FIG. 3C and FIG. 3D) such that respective portions of dielectric materials 421 (e.g., portions at the edges corresponding to edges 340E1 through 340E5 in FIG. 3D) can form part of staircase structure 333.

Figure 6:
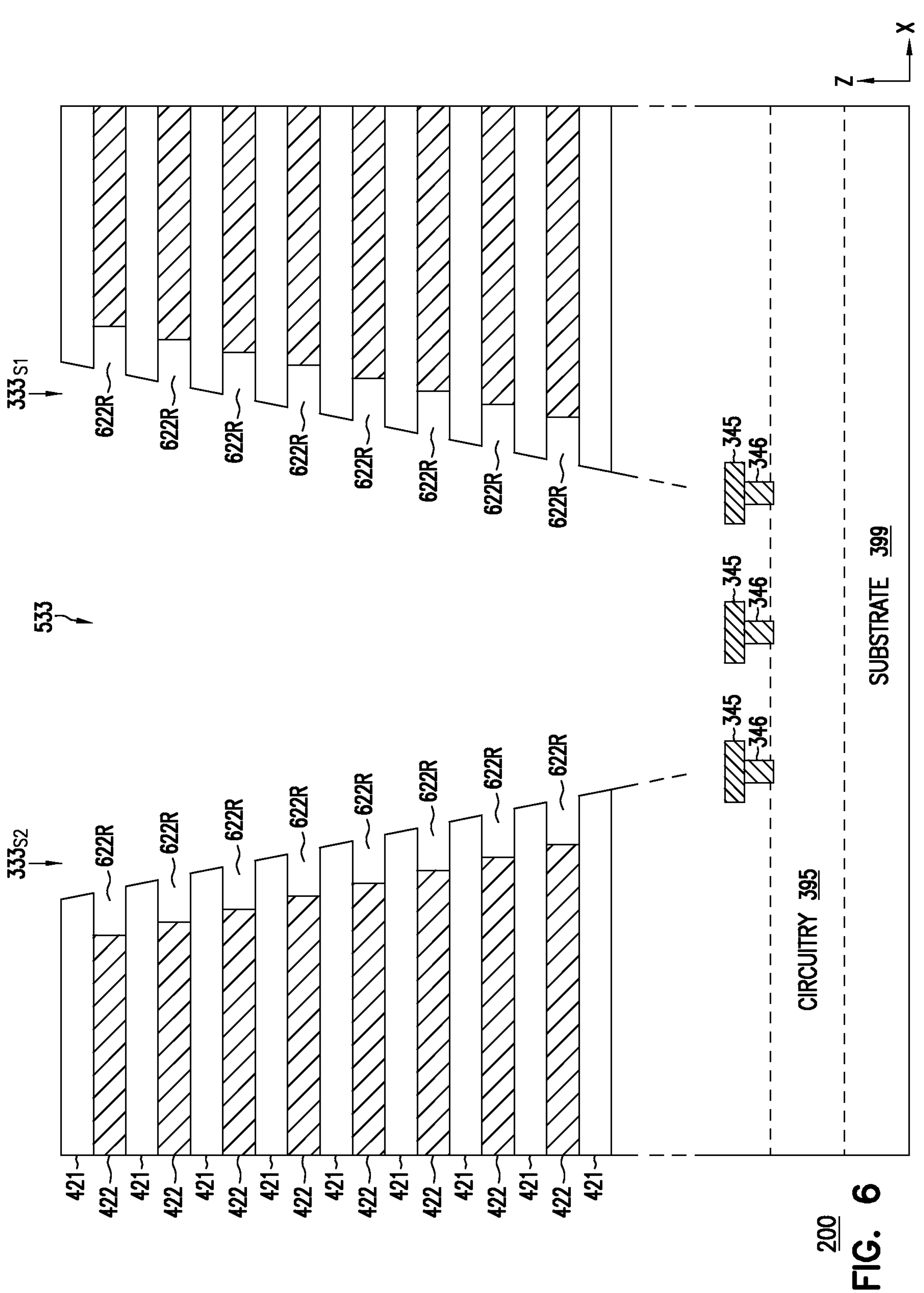

FIG. 6 shows memory device 200 after recesses (e.g., pockets) 622R are formed. Forming recesses 622R can include removing (e.g., etching) portions (e.g., silicon nitride) 422P (FIG. 5A) that were exposed at opening 533. The locations of recesses 622R (FIG. 6) are the locations of the removed portions (portions 422P) of dielectric materials 422. As shown in FIG. 6, recesses 622R are formed on respective levels (e.g., tiers) of memory device 200 adjacent respective remaining portions of dielectric materials 422.

Figure 7:
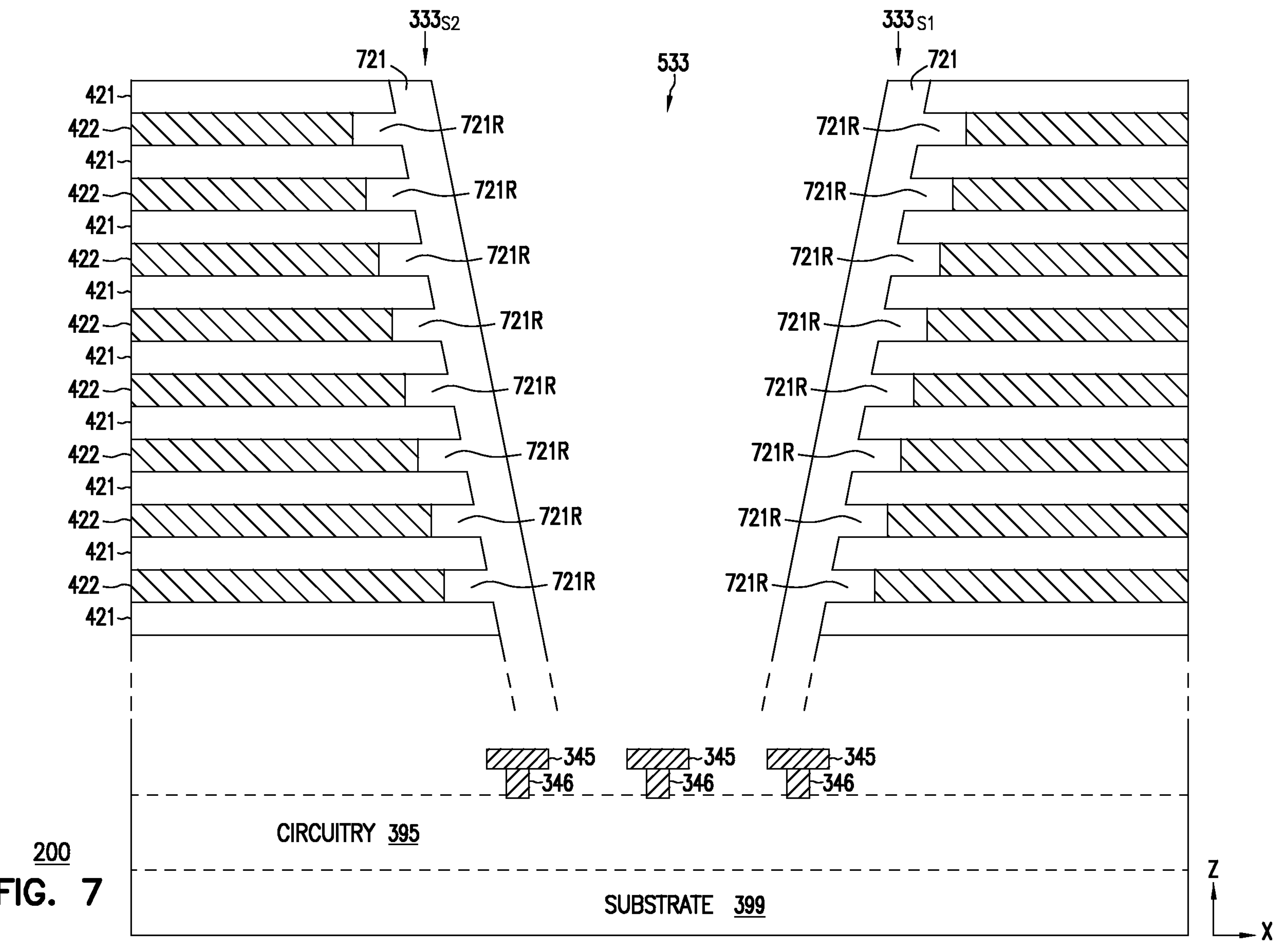

FIG. 7 shows memory device 200 after dielectric material (e.g., silicon dioxide) 721 is formed. Dielectric material 721 can be formed (e.g., deposited) such at that it can include a portion on sidewalls $\mathbf{533}_{SW1}$ and $\mathbf{533}_{SW2}$ (labeled in FIG. 5A) and portions (e.g., silicon dioxide) 721R located in (e.g., formed in) respective recesses 622R on sides $\mathbf{333}_{S1}$ and $\mathbf{333}_{S2}$. As shown in FIG. 7, since sidewalls $\mathbf{533}_{SW1}$ and $\mathbf{533}_{SW2}$ have slopes M1' and M2', respectively, the surfaces (not labeled) of dielectric material 721 on respective sides $\mathbf{333}_{S1}$ and $\mathbf{333}_{S2}$ at opening 533 can also have respective slopes based on respective slopes M1' and M2'.

Figure 8:
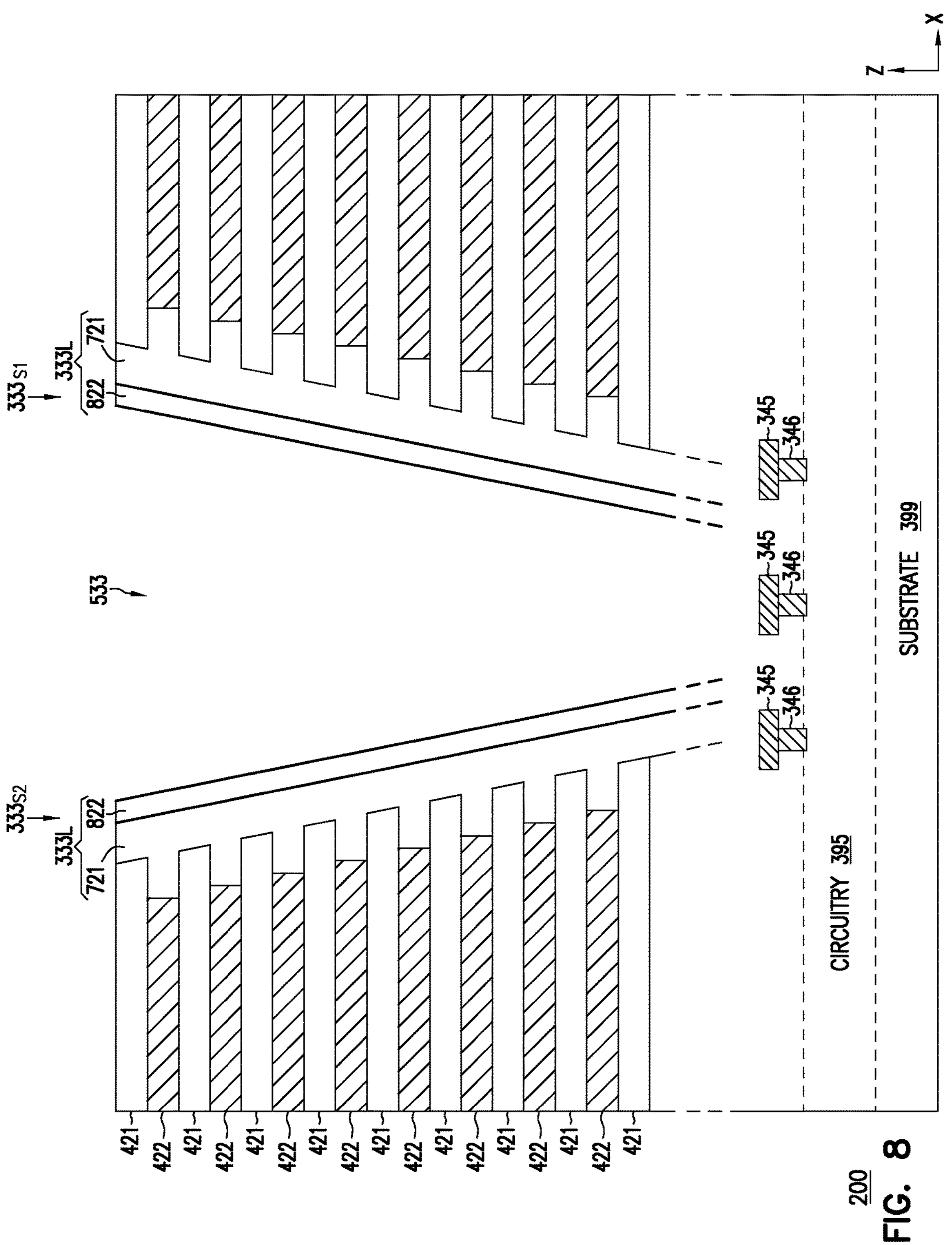

FIG. 8 shows memory device 200 after dielectric material (e.g., silicon nitride) 822 is formed adjacent (e.g., formed on) dielectric material 721 on sides $\mathbf{333}_{S1}$ and $\mathbf{333}_{S2}$. Since dielectric material 721 has respective slopes on sides $\mathbf{333}_{S1}$ and $\mathbf{333}_{S2}$, M1' and M2', dielectric material 822 can also have slopes (e.g., slopes based on slope M1' and M2') on respective sides $\mathbf{333}_{S1}$ and $\mathbf{333}_{S2}$.

Thus, the processes associated with FIG. 6 and FIG. 7 can include forming dielectric liner 333L (including dielectric materials 721 and 822) in respective sidewalls $\mathbf{533}_{W1}$ and $\mathbf{533}_{W2}$, such that portions 721R of dielectric liner 333L are formed in recesses 622R.

Figure 9:
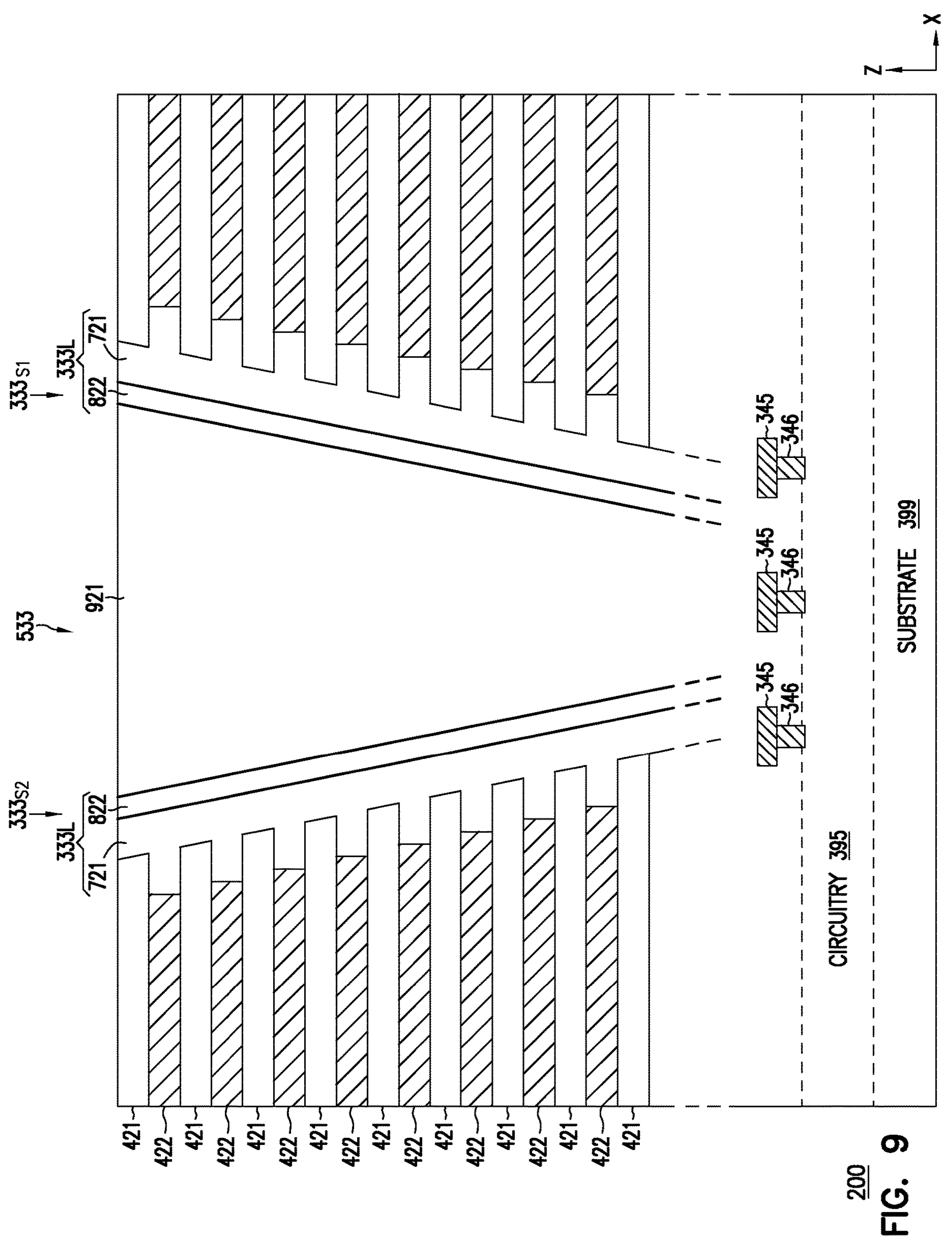

FIG. 9 shows memory device 200 after dielectric material (e.g., silicon dioxide) 921 is formed in opening 533.

Figure 10A:
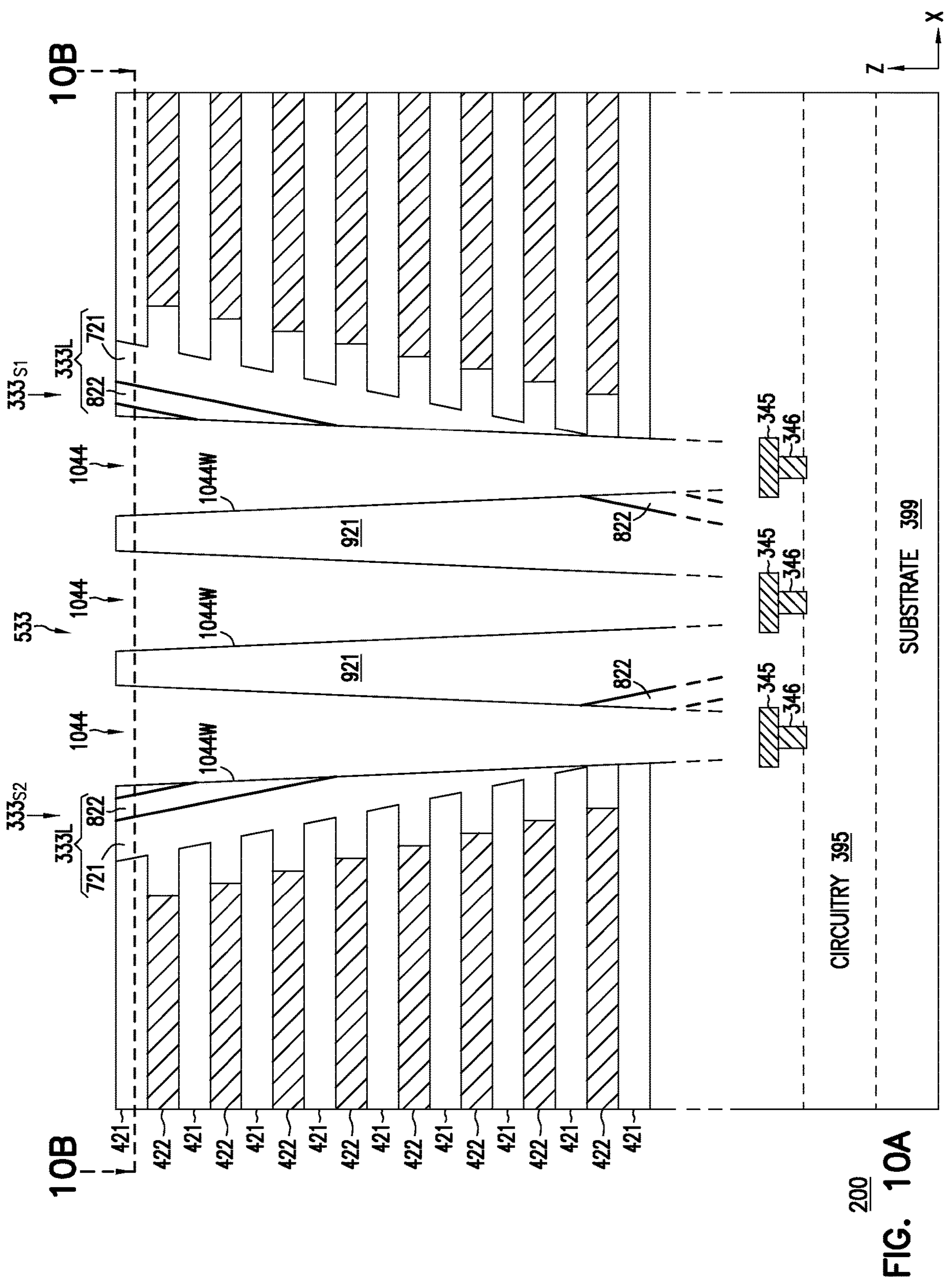
Figure 10B:
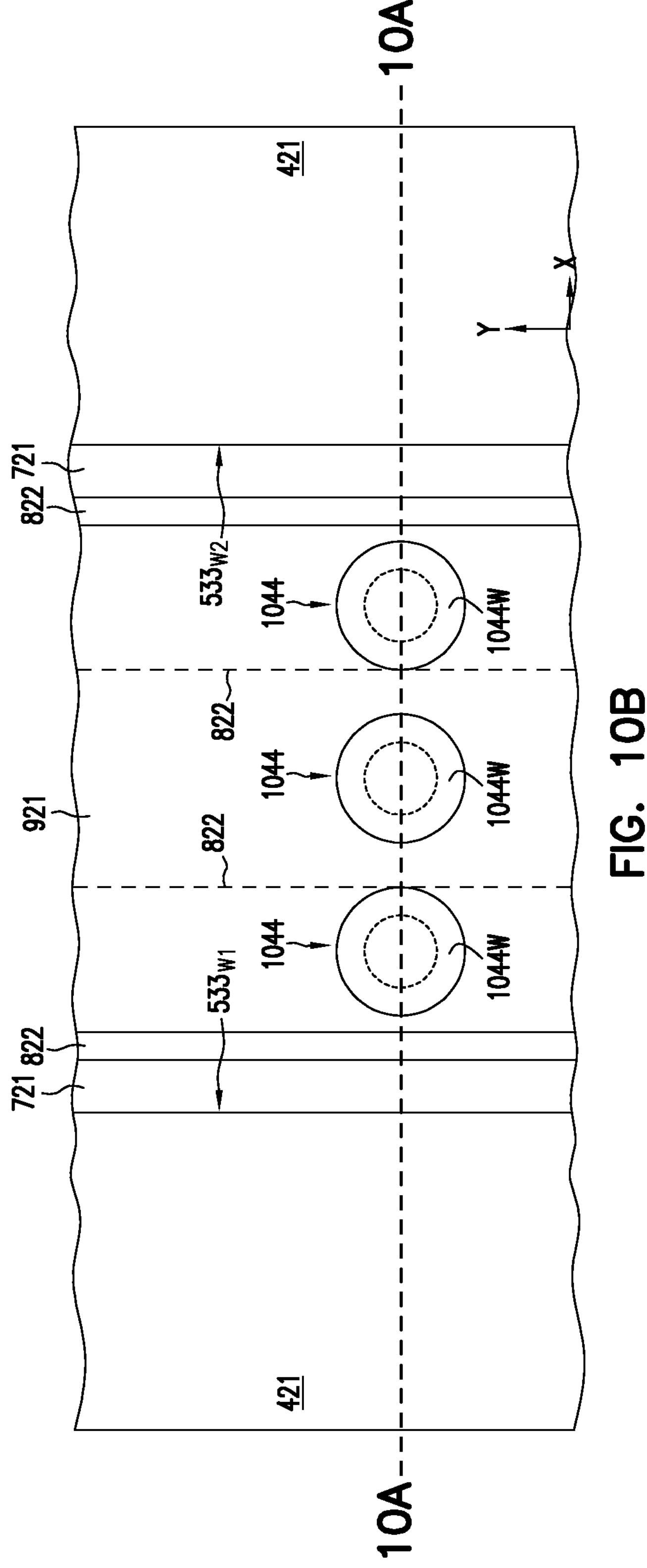

FIG. 10A and FIG. 10B show memory device 200 after openings 1044 are formed. FIG. 10B shows a portion of memory device 200 along line 10B-10B of FIG. 10A. Line 10A-10A in FIG. 10B shows the location corresponding to a side view of memory device 200 in FIG. 10A. Openings 1044 are holes (e.g., deep holes). Each of openings (e.g., holes) 1044 can include a length (e.g., a depth) in the Z-direction and a sidewall 1044W.

As shown in FIG. 10A, since dielectric liner 333L on side $\mathbf{333}_{S1}$ has a slope (e.g., like slope M1' in FIG. 5A), opening 1044 in FIG. 10A on side $\mathbf{333}_{S1}$ extends through (is formed through) a portion of dielectric liner 333L on side $\mathbf{333}_{S1}$. Thus, forming openings 1044 on side $\mathbf{333}_{S1}$ can include removing (e.g., etching) a portion of dielectric material 921 and removing a portion of dielectric liner 333L on side $\mathbf{333}_{S1}$ (that includes removing a portion of dielectric material 721 on side $\mathbf{333}_{S1}$ and removing a portion of dielectric material 822 on side $\mathbf{333}_{S1}$).

Similarly, since dielectric liner 333L on side $\mathbf{333}_{S2}$ has a slope (e.g., like slope M2' in FIG. 5A), opening 1044 in FIG. 10A on side $\mathbf{333}_{S2}$ extends through (is formed through) a portion of dielectric liner 333L on side $\mathbf{333}_{S2}$. Thus, forming openings 1044 on side $\mathbf{333}_{S2}$ can include removing (e.g., etching) a portion of dielectric material 921 and removing (e.g., etching) a portion of dielectric liner 333L on side $\mathbf{333}_{S2}$ (that includes removing a portion of dielectric material 721 on side $\mathbf{333}_{S2}$ and removing a portion of dielectric material 822 on side $\mathbf{333}_{S2}$).

As shown in FIG. 10A and FIG. 10B, although openings 1044 can be concurrently (simultaneously) formed, forming some of openings 1044 (e.g., opening 1044 between openings 1044 respective sides $\mathbf{333}_{S1}$ and $\mathbf{333}_{S2}$) may not include removing a portion of dielectric material 721 on side $\mathbf{333}_{S1}$ and a portion of dielectric material 721 on side $\mathbf{333}_{S2}$. For example, forming some of openings 1044 (e.g., opening 1044 between respective sides $\mathbf{333}_{S1}$ and $\mathbf{333}_{S2}$) can include removing a portion of dielectric material 921 and not removing a portion of dielectric material 721 on side $\mathbf{333}_{S1}$ and a portion of dielectric material 721 on side $\mathbf{333}_{S2}$.

Figure 11:
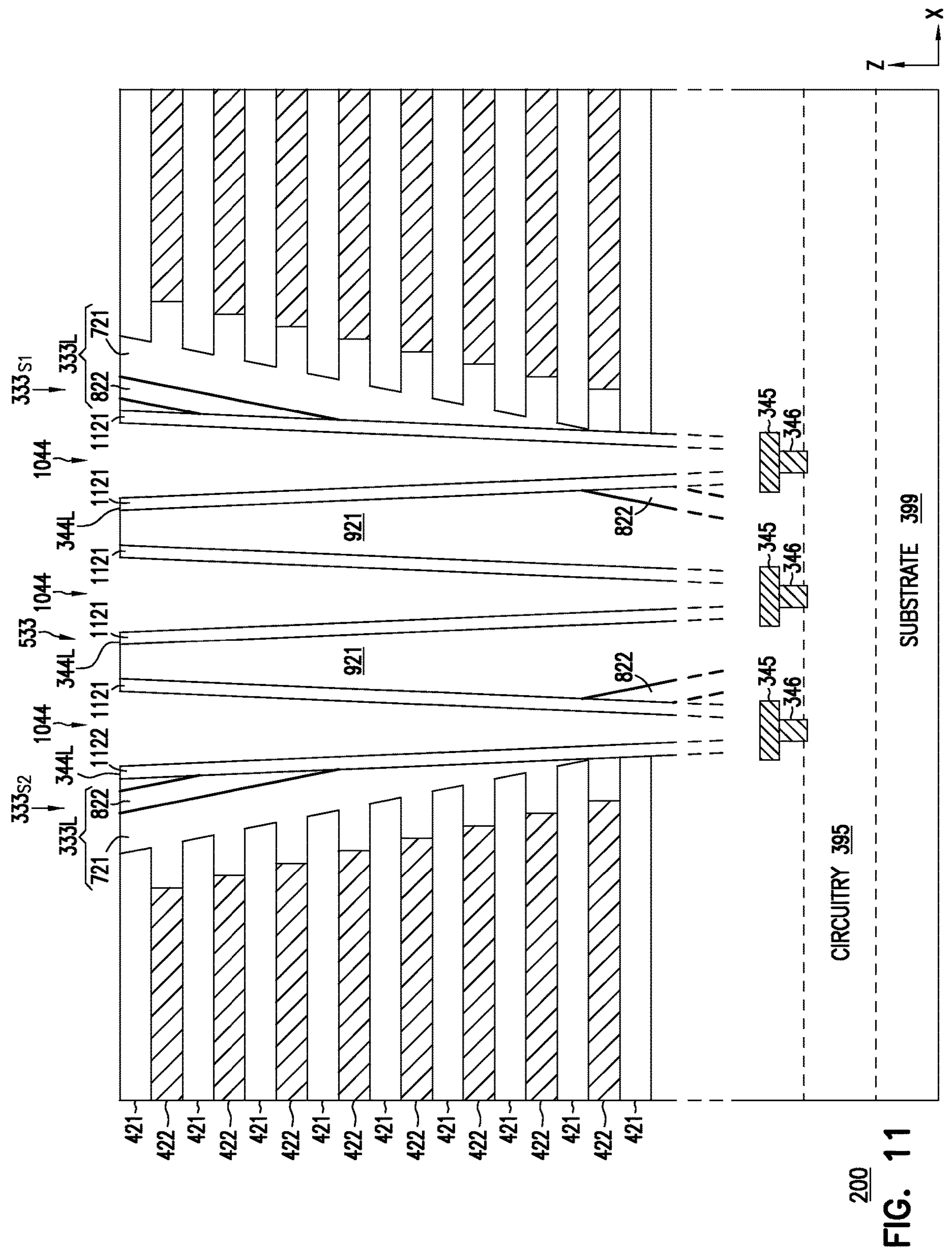

FIG. 11 shows memory device 200 after dielectric liner 344L is formed. Dielectric liner 344L can be formed on sidewalls 1044W (labeled in FIG. 10A) of openings 1044. Dielectric liner 344L can be a relatively thin layer of dielectric material. Forming dielectric liner 344L can include forming dielectric material (or materials) 1121 on sidewall 1044W of respective opening 1044. As described above with reference to FIG. 3G, dielectric material 1121 can include silicon dioxide or a silicon dioxide layer and another layer of dielectric material different from silicon dioxide.

Figure 12:
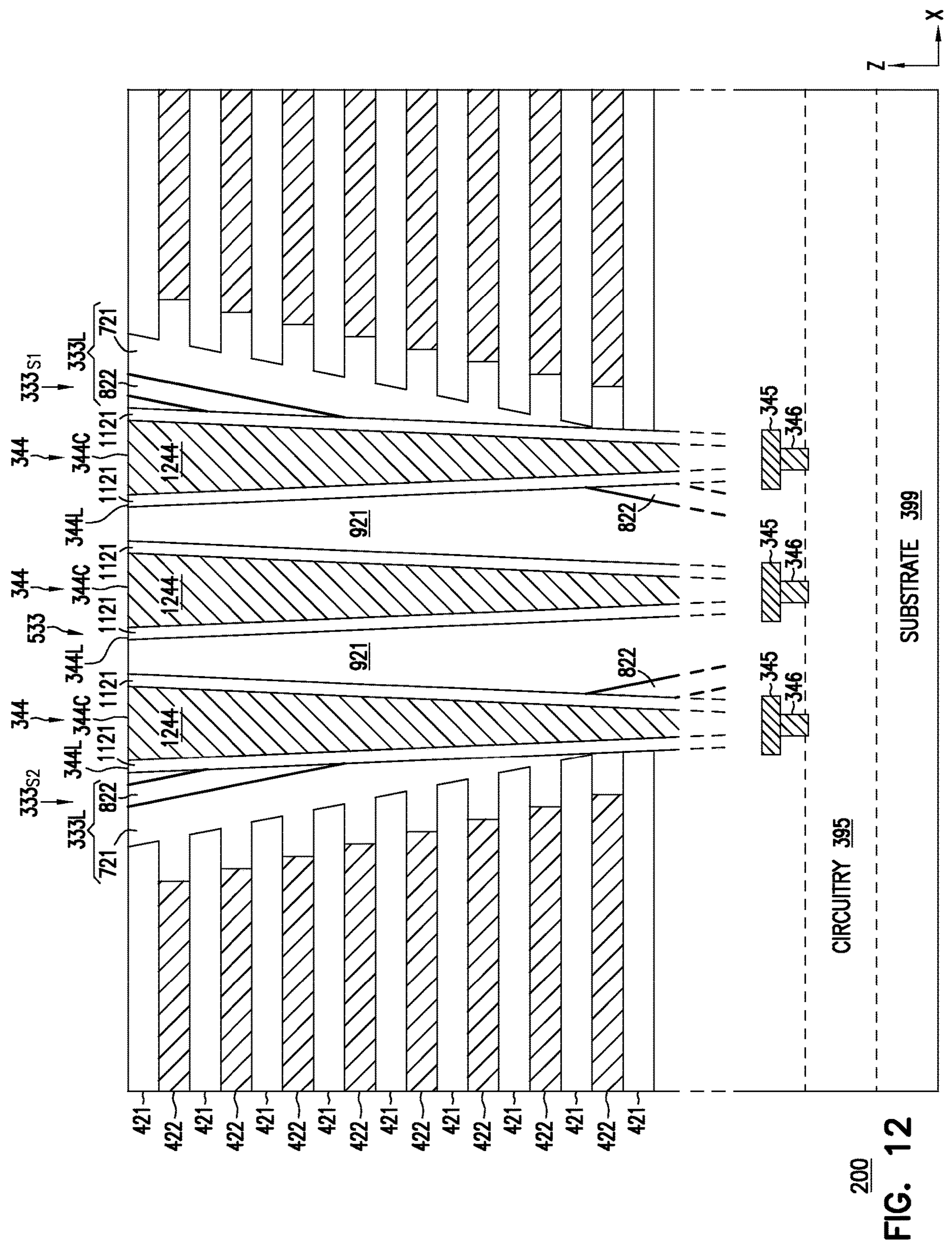

FIG. 12 shows memory device 200 after conductive core 344C is formed adjacent dielectric liner 344L in each of opening 1044. Forming conductive core 344C can include forming (e.g., depositing) conductive material (or materials) 1244 adjacent (e.g., formed on) dielectric liner 344L, such that at least a portion of conductive core 344C is surrounded by dielectric liner 344L. As described above with reference to FIG. 3G, example materials for conductive core 344C include metal (e.g., tungsten or other metals), a combination of metal and alloy, or other conductive materials.

Figure 13:
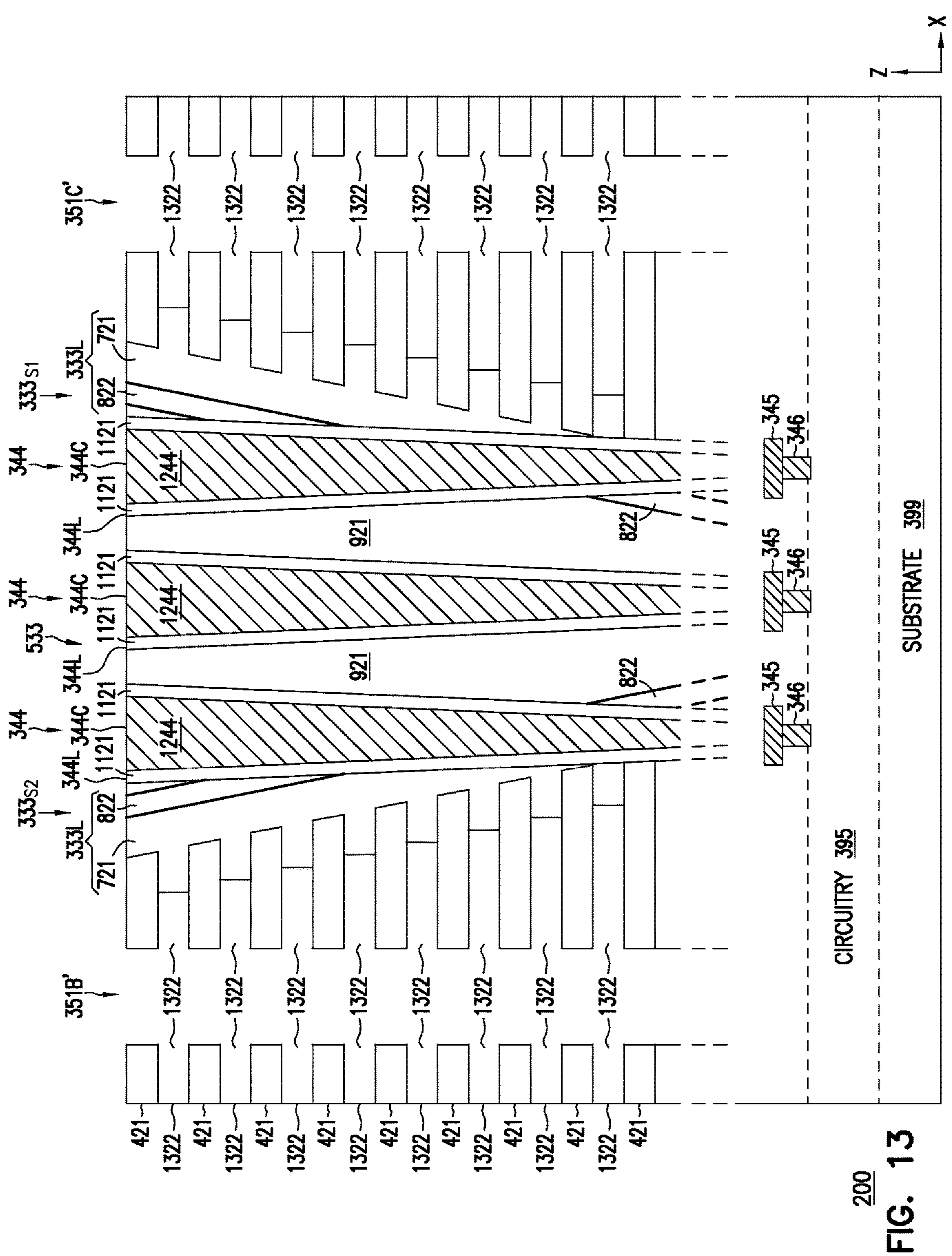

FIG. 13 shows memory device 200 after slits (e.g., trenches) 351B' and 351C' are formed and after dielectric materials 422 from locations 1322 are removed. Slits (e.g., trenches) 351B' and 351C' can be formed before dielectric materials 422 from locations 1322 are removed (e.g., exhumed). Locations 1322 are empty spaces after dielectric materials 422 are removed (as shown in FIG. 13). In subsequent processes (FIG. 14), a conductive material (or conductive materials) can be formed in locations 1322 to form respective control gates and select gates (e.g., source select gates) of memory device 200.

Figure 14:
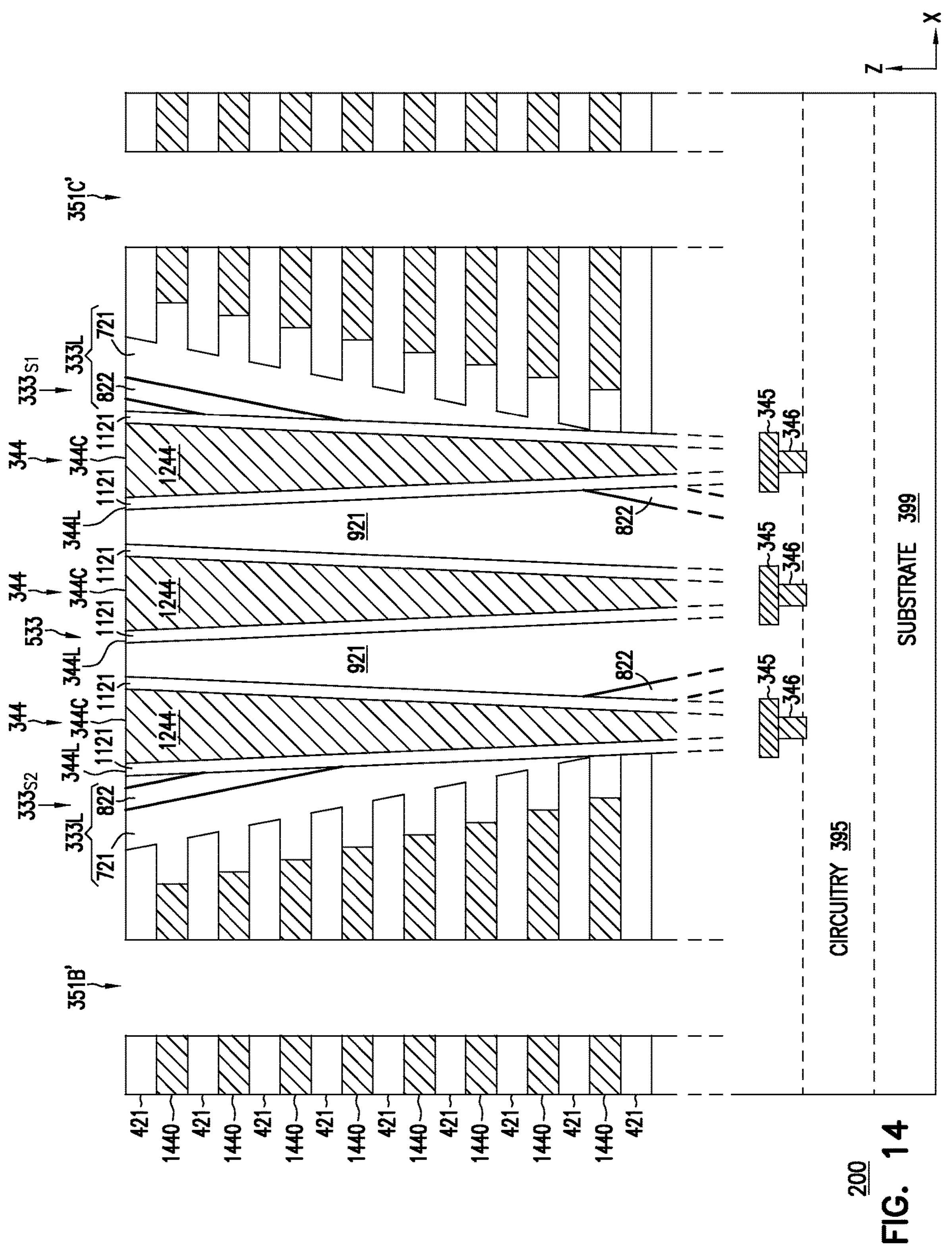

FIG. 14 shows memory device 200 after conductive materials 1440 is formed in locations 1322. Forming conductive materials 1440 can include forming (e.g., depositing) a single conductive material (e.g., tungsten or other metals) in locations 1322 (labeled in FIG. 13), or alternatively, forming (e.g., depositing) multiple conductive materials (one at a time) in locations 1322. As described above with reference to FIG. 3G, conductive materials 1440 can form part of the control gates (e.g., the control gates associated with signals $WL_0$ through $WL_M$ shown in the Y-Z direction in FIG. 3D) of memory device 200.

Figure 15:
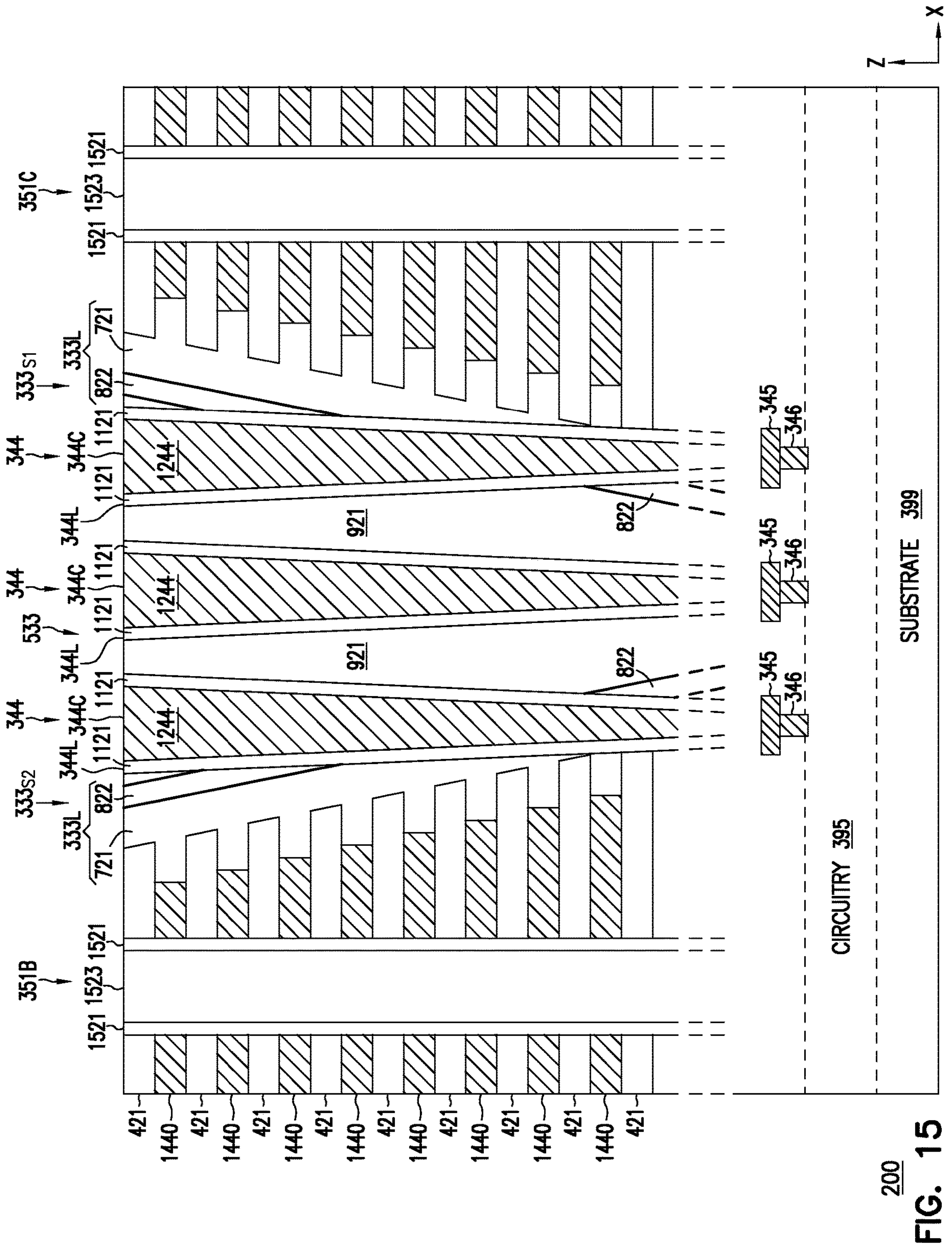

FIG. 15 shows memory device 200 after dielectric structures 351B and 351C. Forming dielectric structures 351B and 351C can including forming material 1521 on sidewalls of slits 351B' and 351C' (labeled in FIG. 14). Then, material 1523 can be formed (e.g., filled) in slits 351B' and 351C'.

Although not shown in FIG. 4 through FIG. 15, the processes of forming memory device 200 also include forming conductive contacts $\mathbf{365}_{SGS}$, $\mathbf{365}_0$-$\mathbf{365}_M$ (FIG. 3C and FIG. 3D) after contact structures 344 (described above) are formed. The processes of forming memory device 200 also include forming pillars 330 (FIG. 3D) of respective memory cell strings 230 (FIG. 3D). For example, the processes of forming memory device 200 can include forming memory cell strings 230 including forming respective pillars 330 of memory cell strings 230 before forming contact structures 344 (described above) and conductive contacts $\mathbf{365}_{SGS}$, $\mathbf{365}_0$-$\mathbf{365}_M$. Forming respective pillars 330 can includes forming holes in dielectric materials 421 and 422 (FIG. 4) and then forming pillars 330 in the holes.

The process of forming memory device 200 as described above with reference to FIG. 4 through FIG. 15 can include additional processes after the processes associated with FIG. 15 are performed. For example, additional processes can include forming drain select gates and data lines and other elements and interconnections to complete the processes of forming memory device 200.

As described above with reference to FIG. 6 and FIG. 15, recesses 622R (FIG. 6) are formed (e.g., preformed) before the processes (e.g., before forming openings 1044 in FIG. 10) of forming contact structures 344 are performed. In alternative processes, dielectric liners 333L may be formed without recesses 622R and portions 721R. However, in such alternative processes, part of dielectric liners 333L (formed without recesses 622R and portions 721R) at some regions (e.g., regions like regions 333LP1 and 333LP2 in FIG. 3G) may prevent (e.g., block) access to some of portions 422P (FIG. 4). This prevents formation of recesses 622R at the locations of portions 422P at the regions like regions 333LP1 and 333LP2 in FIG. 3G. Thus, in the alternative processes, recesses 622R may not be formed at some regions (e.g., regions like regions 333LP1 and 333LP2) of staircase structure 333 (FIG. 15). As a result, in the alternative processes, portions 721R are not formed at some regions (e.g., regions like regions 333LP1 and 333LP2) of staircase structure 333. This can reduce the reliability and performance of the memory device, as described above with reference to FIG. 3G.

In the processes described above with reference to FIG. 4 through FIG. 15, recesses 622R (FIG. 6) are preformed and portions 721R (FIG. 7) are also preformed in respective recesses 622R. For example, as described above, recesses 622R (FIG. 6) are formed (e.g., preformed) before the processes (e.g., before forming openings 1044 in FIG. 10) associated with FIG. 10 through FIG. 12 of forming contact structures 344 are performed. Forming (e.g., preforming) recesses 622R in this order (e.g., formed before openings 1044 in FIG. 10 are formed) allows portions 722R1 to be formed between contact structures 344 on sides $\mathbf{333}_{S1}$ and $\mathbf{333}_{S2}$ and each of conductive materials 1440 (FIG. 14) on sides $\mathbf{333}_{S1}$ and $\mathbf{333}_{S2}$. This allows memory device 200 to have improvements and benefits as described above with reference to FIG. 3G.

The illustrations of apparatuses (e.g., memory devices 100 and 200) and methods (e.g., methods of forming memory device 200) are intended to provide a general understanding of the structure of various embodiments and are not intended to provide a complete description of all the elements and features of apparatuses that might make use of the structures described herein. An apparatus herein refers to, for example, either a device (e.g., any of memory devices 100 and 200) or a system (e.g., an electronic item that can include any of memory devices 100 and 200).

Any of the components described above with reference to FIG. 1 through FIG. 15 can be implemented in a number of ways, including simulation via software. Thus, apparatuses (e.g., memory devices 100 and 200), or part of each of these memory devices described above, may all be characterized as "modules" (or "module") herein. Such modules may include hardware circuitry, single- and/or multi-processor circuits, memory circuits, software program modules and objects and/or firmware, and combinations thereof, as desired and/or as appropriate for particular implementations of various embodiments. For example, such modules may be included in a system operation simulation package, such as a software electrical signal simulation package, a power usage and ranges simulation package, a capacitance-inductance simulation package, a power/heat dissipation simulation package, a signal transmission-reception simulation package, and/or a combination of software and hardware used to operate or simulate the operation of various potential embodiments.

The memory devices (e.g., memory devices 100 and 200) described herein may be included in apparatuses (e.g., electronic circuitry) such as high-speed computers, communication and signal processing circuitry, single- or multi-processor modules, single or multiple embedded processors, multicore processors, message information switches, and application-specific modules including multilayer, multichip modules. Such apparatuses may further be included as subcomponents within a variety of other apparatuses (e.g., electronic systems), such as televisions, cellular telephones, personal computers (e.g., laptop computers, desktop computers, handheld computers, tablet computers, etc.), workstations, radios, video players, audio players (e.g., MP3 (Motion Picture Experts Group, Audio Layer 3) players), vehicles, medical devices (e.g., heart monitor, blood pressure monitor, etc.), set top boxes, and others.

The embodiments described above with reference to FIG. 1 through FIG. 15 include apparatuses and methods of forming the apparatuses. One of the apparatuses includes tiers located one over another, the tiers including conductive materials that form part of respective control gates for memory cells of the apparatus; a staircase structure formed in the tiers, the conductive materials including respective portions that collectively form a part of the staircase structure, the staircase structure including a sidewall on a side of the staircase structure; a dielectric liner formed on the sidewall; recesses formed in respective tiers and adjacent the sidewall such that respective portions of the dielectric liner are located in the recesses; and a contact structure extending through a portion of the dielectric liner, wherein the portions of the dielectric liner are between the contract structure and the conductive materials. Other embodiments, including additional apparatuses and methods, are described.

In the detailed description and the claims, the term "on" used with respect to two or more elements (e.g., materials), one "on" the other, means at least some contact between the elements (e.g., between the materials). The term "over" means the elements (e.g., materials) are in close proximity, but possibly with one or more additional intervening elements (e.g., materials) such that contact is possible but not required. Neither "on" nor "over" implies any directionality as used herein unless stated as such.

In the detailed description and the claims, a list of items joined by the term "at least one of" can mean any combination of the listed items. For example, if items A and B are listed, then the phrase "at least one of A and B" means A only; B only; or A and B. In another example, if items A, B, and C are listed, then the phrase "at least one of A, B, and C" means A only; B only; C only; A and B (excluding C); A and C (excluding B); B and C (excluding A); or all of A, B, and C. Item A can include a single element or multiple elements. Item B can include a single element or multiple elements. Item C can include a single element or multiple elements.

In the detailed description and the claims, a list of items joined by the term "one of" can mean only one of the list items. For example, if items A and B are listed, then the phrase "one of A and B" means A only (excluding B), or B only (excluding A). In another example, if items A, B, and C are listed, then the phrase "one of A, B, and C" means A only; B only; or C only. Item A can include a single element or multiple elements. Item B can include a single element or multiple elements. Item C can include a single element or multiple elements.

In the detailed description and the claims, the terms "first," "second," and "third," etc. are used merely as labels, and are not intended to impose numerical requirements on their objects.

The above description and the drawings illustrate some embodiments of the inventive subject matter to enable those skilled in the art to practice the embodiments of the inventive subject matter. Other embodiments may incorporate structural, logical, electrical, process, and other changes. Examples merely typify possible variations. Portions and features of some embodiments may be included in, or substituted for, those of others. Many other embodiments will be apparent to those of skill in the art upon reading and understanding the above description.

What is claimed is:

1. An apparatus comprising:

tiers located one over another over a substrate, the tiers including conductive materials that form part of respective control gates for memory cells of the apparatus;

a staircase structure formed in the tiers, the conductive materials including respective portions that collectively form a part of the staircase structure, the staircase structure including a sidewall on a side of the staircase structure;

a dielectric liner formed on the sidewall at a slanted angle with respect to the substrate;

recesses formed in respective tiers and adjacent the sidewall such that respective portions of the dielectric liner are located in the recesses; and a contact structure extending through a portion of the dielectric liner, wherein the portions of the dielectric liner are between the contact structure and the conductive materials, the contact structure is electrically separated from the conductive materials, and the contact structure does not extend through the tiers.

2. The apparatus of claim 1, wherein the portions of the dielectric liner include silicon dioxide.

3. The apparatus of claim 1, wherein the dielectric liner includes:

silicon dioxide, and the portions of the dielectric liner are part of the silicon dioxide; and silicon nitride adjacent the silicon dioxide, and the contact structure extending through the silicon nitride and the silicon dioxide.

4. The apparatus of claim 1, further comprising a conductive contact adjacent the contact structure and contacting one of the conductive materials, wherein the conductive contact and the contact structure have different lengths.

5. The apparatus of claim 1, wherein the contact structure includes a conductive core and a dielectric liner adjacent the conductive core, wherein the conductive core and the dielectric liner of the contact structure extend through the portion of the dielectric liner.

6. The apparatus of claim 5, wherein the dielectric liner of the contact structure has a same material as the portions of the dielectric liner in the recesses.

7. The apparatus of claim 1, wherein the apparatus comprises a memory device, the memory device including circuitry located under the tiers, and the contact structure is coupled to the circuitry.

8. An apparatus comprising:

tiers located one over another over a substrate, the tiers including conductive materials;

a staircase structure formed in the tiers, the conductive materials including respective portions that collectively form a part of the staircase structure, the staircase structure including a first sidewall on a first side of the staircase, and a second sidewall on a second side opposite the first side of the staircase;

a first dielectric liner formed on the first sidewall at a first slanted angle with respect to the substrate;

a second dielectric liner formed on the second sidewall at a second slanted angle with respect to the substrate;

first recesses formed in respective tiers and adjacent the first sidewall such that respective portions of the first dielectric liner are located in the first recesses;

second recesses formed in respective tiers and adjacent the second sidewall such that respective portions of the second dielectric liner are located in the second recesses;

a first contact structure extending through a portion of the first dielectric liner, wherein the portions of the first dielectric liner are between the first contact structure and a first portion of the conductive materials, the first contact structure is electrically separated from the conductive materials, and the first contact structure does not extend through the tiers; and a second contact structure extending through a portion of the second dielectric liner, wherein the portions of the second dielectric liner are between the second contact structure and a second portion of the conductive materials, the second contact structure is electrically separated from the conductive materials, and the second contact structure does not extend through the tiers.

9. The apparatus of claim 8, wherein the first and second contact structures have a same length.

10. The apparatus of claim 8, wherein:

the portions of the first dielectric liner include silicon dioxide adjacent the first portion of the conductive materials; and the portions of the second dielectric liner include silicon dioxide adjacent the second portion of the conductive materials.

11. The apparatus of claim 10, wherein:

the first dielectric liner includes silicon nitride adjacent the silicon dioxide of the first dielectric liner; and the second dielectric liner includes silicon nitride adjacent the silicon dioxide of the second dielectric liner.

12. The apparatus of claim 11, wherein:

the first contact structure extends through the silicon nitride and the silicon dioxide of the first dielectric liner; and the second contact structure extends through the silicon nitride and the silicon dioxide of the second dielectric liner.

13. The apparatus of claim 8, further comprising a third contact structure adjacent the first and second contact structures and having a length in a same direction with respective lengths of the first and second contact structures.

14. The apparatus of claim 13, wherein the first, second, and third contact structures have a same length.

* * * * *